United States Patent
Schneider et al.

(10) Patent No.: US 10,887,012 B1
(45) Date of Patent: Jan. 5, 2021

(54) SYSTEMS AND METHODS FOR TUNING LASERS USING REFLECTED OPTICAL SIGNALS

(71) Applicant: ADTRAN, Inc., Huntsville, AL (US)

(72) Inventors: Kevin W. Schneider, State College, PA (US); Leif J. Sandstrom, Madison, AL (US); John G. Brooks, Madison, AL (US); George Bekken, Santa Clara, CA (US)

(73) Assignee: ADTRAN, Inc., Huntsville, AL (US)

( * ) Notice: Subject to any disclaimer, the term of this patent is extended or adjusted under 35 U.S.C. 154(b) by 0 days.

(21) Appl. No.: 16/262,647

(22) Filed: Jan. 30, 2019

(51) Int. Cl.
| | |
|---|---|
| *H04B 10/079* | (2013.01) |
| *H04J 14/02* | (2006.01) |
| *H01S 3/105* | (2006.01) |
| *H04B 10/071* | (2013.01) |
| *G01S 17/10* | (2020.01) |

(52) U.S. Cl.
CPC ....... *H04B 10/07957* (2013.01); *H01S 3/105* (2013.01); *H04B 10/071* (2013.01); *H04B 10/07955* (2013.01); *H04J 14/0221* (2013.01); *G01S 17/10* (2013.01); *H04J 14/02* (2013.01)

(58) Field of Classification Search
CPC ............ H04B 10/07957; H04B 10/071; H04B 10/07955; H04B 10/08; H01S 3/105; H04J 14/0221; H04J 14/00; H04J 14/02; G01C 3/08; G01M 11/00; G01S 17/10
USPC .......................................................... 398/79
See application file for complete search history.

(56) References Cited

U.S. PATENT DOCUMENTS

| | | | | |
|---|---|---|---|---|
| 5,179,420 | A * | 1/1993 | So ...................... | G01M 11/3127 356/73.1 |
| 8,320,760 | B1 * | 11/2012 | Lam .................... | H04L 14/0282 398/66 |
| 9,143,228 | B2 * | 9/2015 | Sandstrom ............ | H04B 10/40 |
| 9,419,707 | B2 * | 8/2016 | Daems ................. | H04B 10/071 |
| 10,591,600 | B2 * | 3/2020 | Villeneuve ............. | G01S 17/02 |
| 2008/0089699 | A1 | 4/2008 | Li et al. | |
| 2011/0013904 | A1 * | 1/2011 | Khermosh ......... | G01M 11/3118 398/16 |
| 2011/0249973 | A1 * | 10/2011 | Donlagic .............. | G01J 9/0246 398/79 |

(Continued)

OTHER PUBLICATIONS

Moon, et al., "Automatic Wavelength Control Method Using Rayleigh Backscattering for WDM-PON with Tunable Lasers," Department of Electrical Engineering, Korea Advanced Institute of Science and Technology, OSA/CLEO, 2011.

(Continued)

*Primary Examiner* — Abbas H Alagheband
(74) *Attorney, Agent, or Firm* — Maynard Cooper & Gale, P.C.; Jon E. Holland

(57) ABSTRACT

A laser tuning system includes an optical transmitter having a tunable laser that transmits optical signals at various wavelengths to an optical fiber through an optical component, which attenuates a range of wavelengths of the optical signal. An optical detector detects optical returns that have been reflected from the fiber at points beyond the optical component. A tuning control module analyzes the optical returns in order to provide a tuning value for tuning the laser to a desired wavelength. As an example, the laser may be tuned in order to maximize or otherwise increase the amount of optical power passing through the optical component.

19 Claims, 13 Drawing Sheets

(56) References Cited

U.S. PATENT DOCUMENTS

| | | | | |
|---|---|---|---|---|
| 2013/0039656 A1* | 2/2013 | Lam | ............... | H04J 14/0235 |
| | | | | 398/47 |
| 2015/0340832 A1* | 11/2015 | Meli | ............... | H04J 14/0221 |
| | | | | 398/49 |
| 2016/0043798 A1* | 2/2016 | Chen | ............... | H04B 10/071 |
| | | | | 398/21 |
| 2016/0187224 A1* | 6/2016 | Chen | ............... | G01M 11/3181 |
| | | | | 356/73.1 |
| 2016/0191154 A1* | 6/2016 | Lin | ............... | H04B 10/07957 |
| | | | | 398/16 |
| 2018/0364356 A1* | 12/2018 | Eichenholz | ............... | H01S 5/4087 |
| 2020/0049587 A1* | 2/2020 | Rapp | ............... | G01M 11/3109 |

OTHER PUBLICATIONS

Mun, et al., "A Self Wavelength Tracking Method for a Cost Effective WDM-PON with Tunable Lasers," School of Electrical Engineering and Computer Science, Korea Advanced Institute of Science and Technology, OSA/OFC/NFOEC, 2010.

Effenberger, et al., "In-Band Optical Frequency Domain Reflectometry in PONs," Huawei Technologies Co., Ltd., OFC/NFOEC, 2008.

* cited by examiner

SYSTEMS AND METHODS FOR TUNING LASERS USING REFLECTED OPTICAL SIGNALS

RELATED ART

In fiber-optic communication systems, optical signals are used to carry data sometimes across great distances. It is well known that optical signals typically provide significantly higher data rates than those enabled by electrical signals. An optical signal is generated by an optical transmitter, which includes a laser that generates the optical signal based on an input signal modulated with the data to be transmitted.

The optical signal can be transmitted over an optical path to a destination via a number of interconnected optical fibers. This optical path may include a wavelength division multiplexer (WDM) such as an arrayed waveguide grating (AWG). The WDM is connected to a plurality of local fibers on one side and the main optical fiber on the other side. The WDM has a number of channels spanning a range of wavelengths. Each channel has a bandwidth and is centered at a certain wavelength within the range of wavelengths. When the WDM is designed to have Gaussian or similar shaped channels, the closer that the wavelength of a transmitted optical signal corresponds to the center wavelength of its associated WDM channel, the greater the percentage of the power of the transmitted optical signal that is passed through the channel of the WDM. If the transmitted optical signal remains within the wavelength range of the WDM channel, but deviates from the center wavelength, the percentage of the power of the transmitted optical signal that is passed through the channel will decrease.

An optical transmitter is typically associated with a single channel of a WDM. In order for the optical signal to be passed through the WDM, the laser of the optical transmitter must output an optical signal that falls within the range of wavelengths that are passed by the associated WDM channel. The closer that the output wavelength of the laser matches the center wavelength of the WDM channel, the greater the percentage of the power of the transmitted optical signal that will be passed to the main optical fiber. Accordingly, it is desired to configure the laser of the optical transmitter such that the wavelength of the transmitted optical signal closely matches the center wavelength of the associated WDM channel.

Tunable lasers have a wavelength that can be altered based on a control input. However, the wavelength that is output by a tunable laser may change over time due to various environmental or equipment factors. For example, in many lasers the output wavelength will change with laser temperature. As another example, many lasers experience a drift in output wavelength after an extended period of use. This may result in the tunable laser having a different output wavelength over time for the same control signal value. Given the relatively small range of wavelengths associated with each channel of a WDM, and the Gaussian attenuation as the transmitted wavelength departs from the center wavelength of the channel, these changes in the wavelength output by the laser may result in a substantial decrease in the power of the optical signal that is passed through the WDM channel to the main optical fiber.

Some tunable lasers include technology that provides feedback regarding the wavelength of the optical signal that is output from the tunable laser. For example, some systems may include a tap that diverts a portion of the optical signal to a wavelength locker or similar device that measures the wavelength of the transmitted optical signal. This information may in turn be used to adjust the tuning value that is provided to the tunable laser in order to maintain the tunable laser at the desired wavelength. However, such systems add a significant expense to the cost of a tunable laser.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally pertains to systems and methods for tuning lasers using optical signals reflected from an optical path. An optical transmission system includes an optical transmitter having a tunable laser that transmits optical signals at various wavelengths to an optical fiber through an optical component, which attenuates a range of wavelengths of the optical signal. An optical detector detects optical returns that have been reflected from the fiber at points beyond the optical component. A tuning control module analyzes the optical returns in order to tune the laser to a desired wavelength. As an example, the laser may be tuned in order to maximize or otherwise increase the amount of optical power passing through the optical component.

In one exemplary embodiment, a number of optical transmission systems may each transmit over a respective optical fiber, referred to for simplicity of illustration as "local" fibers, to a wavelength division multiplexer and through the wavelength division multiplexer to an optical fiber, referred to for simplicity of illustration as "main" fiber, that carries signals from each of the local fibers. Each optical transmission system and local fiber may be associated with a channel of the wavelength division multiplexer, and the strength of the optical signal that passes through to the main optical fiber may be based on how closely the wavelength of the transmitted optical signal matches the center wavelength of the associated channel of the wavelength division multiplexer. The tuning control module may update the transmission wavelength of the tunable laser to the center wavelength of the associated channel based on the optical returns reflected from the main optical fiber.

Figure 1:
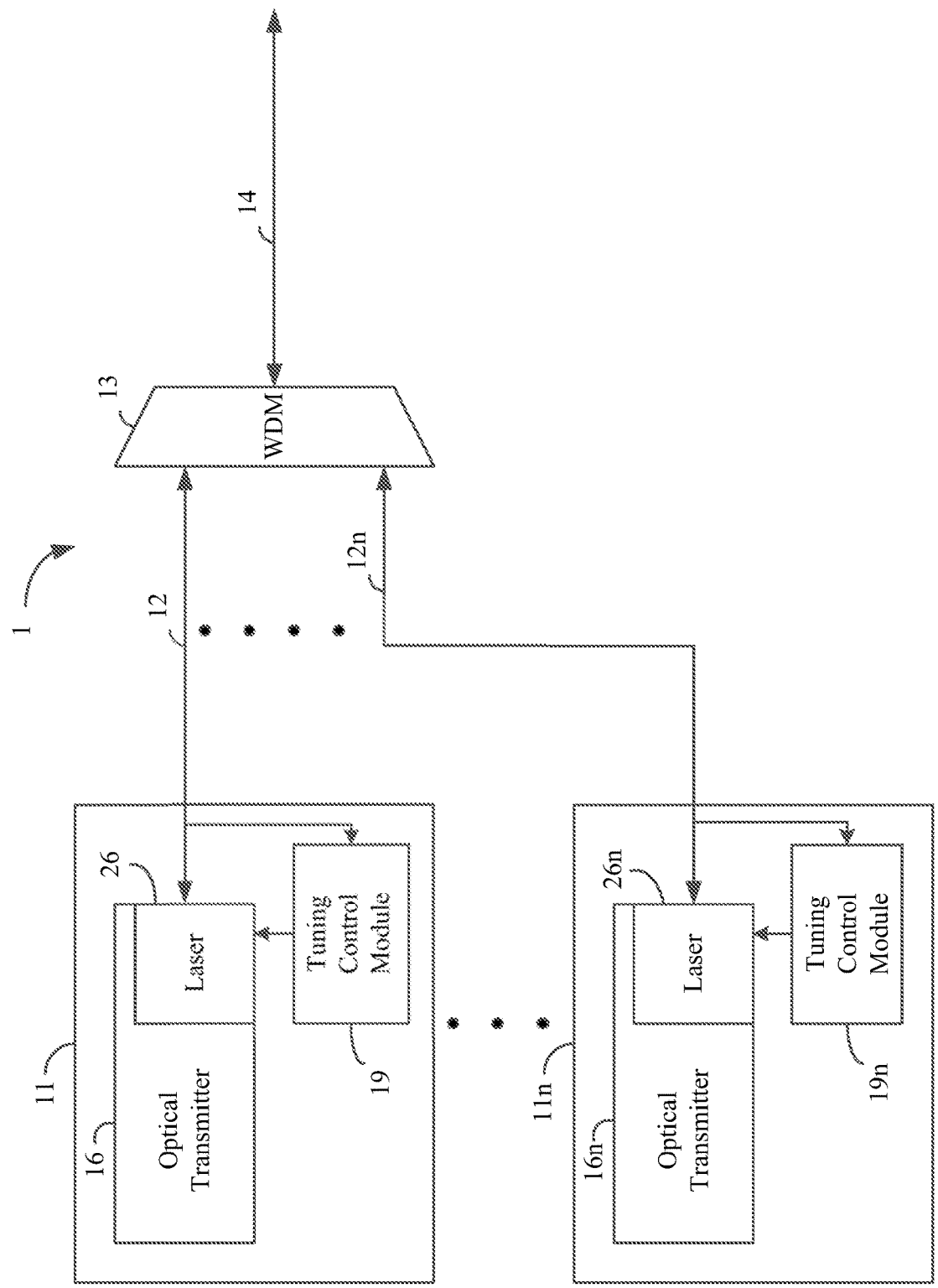
FIG. 1 is a block diagram illustrating an exemplary embodiment of an optical transmission system in which a tunable laser generates an optical signal that is transmitted over an optical path including a wavelength division multiplexer.

FIG. 1 is a block diagram illustrating an exemplary embodiment of an optical transmission system in which a tunable laser 26 generates an optical signal that is transmitted over an optical path that includes a wavelength division multiplexer 13. The embodiment depicted in FIG. 1 includes a plurality of optical transmission systems 11-11$n$. Each of the optical transmission systems 11-11$n$ is coupled to an optical path 1. The optical path 1 includes a plurality of local fibers 12-12$n$, each associated with a corresponding optical transmission system 11-11$n$. Optical path 1 also includes a wavelength division multiplexer 13 that is coupled on one side to each of the local fibers 12-12$n$, and on the other side to a main fiber 14.

Each optical transmission system 11 includes an optical transmitter 16 and a tuning control module 19. Each optical transmitter 16 includes a laser 26. In one embodiment, laser 26 is a tunable laser, and a tuning control module 19 outputs a tuning signal for controlling the wavelength of the optical signal output by the laser 26. The tuning signal may be analog or digital. In one embodiment, the tuning signal defines a digital value that indicates an amount that the wavelength is to be adjusted (increased or decreased) according to a control algorithm, which will be described in more detail hereafter. For purposes of illustration, it will be assumed hereafter that the tuning signal defines a digital value, but other types of tuning signals are possible.

The optical transmitter 16 provides an electrical signal to laser 26, which is converted by laser 26 to an optical signal that is output over the optical path 1 via local fiber 12. Each of a plurality of lasers 26-26$n$ may similarly output optical signals over local fibers 12-12$n$, based on electrical signals from optical transmitters 16-16$n$. Thus, a plurality of optical signals may be provided as inputs to wavelength division multiplexer 13 via local fibers 12-12$n$. Wavelength division multiplexer 13 multiplexes the plurality of optical signals such that a multiplexed signal may be transmitted over single main fiber 14.

In one embodiment, a single wavelength division multiplexer 13 may include a plurality of channels, with each channel being associated with a range of wavelengths. Each channel of the wavelength division multiplexer may also be associated with one of local fibers 12-12$n$, meaning that wavelength division multiplexer 13 has at least n channels. Although it will be understood that any suitable number of channels may be included in wavelength division multiplexer 13, in embodiments the number of channels may be based on the type of wavelength division multiplexer 13, the number of local fibers 12-12$n$, the density of local fibers 12-12$n$, cost factors, or any other suitable criteria. In one exemplary embodiment, the wavelength division multiplexer 13 may be an arrayed waveguide grating and may have 24 channels.

Although the channels of wavelength division multiplexer 13 may be configured in any suitable manner, in one embodiment, the channels may be associated with adjacent wavelength ranges within the overall wavelength range of wavelength division multiplexer 13. For example, each channel may be associated with a wavelength range of approximately 0.8 nm (100 GHz), such that in a 24 channel wavelength division multiplexer 13, the 24 channels occupy approximately 20 nm. The wavelength division multiplexer in turn multiplexes the optical signal from each channel and transmits the multiplexed optical signals over main fiber 14. In this manner, the plurality of optical signals from the plurality of optical transmission systems 11-11$n$ may be transmitted long distances over a single main fiber 14.

The properties of a channel of a wavelength division multiplexer 13 may be such that it is preferable that the wavelength of the optical signal transmitted by a particular laser 26 be matched as closely as possible to the center wavelength of the associated channel. Because each laser 26 is associated with a single local fiber 12, which is associated with a single channel of wavelength division multiplexer 13, the highest quality optical signal generally will be transmitted when the wavelength of the optical signal transmitted by laser 26 matches the center wavelength of the associated channel of wavelength division multiplexer 13.

Tuning control module 19 may receive a reflected optical signal from optical path 1. As will be described hereafter, tuning control module 19 may use that reflected optical signal to tune the laser 26 so that its optical signal is matched to the associated channel of wavelength division multiplexer 13. Moreover, the signal quality that is transmitted through the channel of wavelength division multiplexer 13 to main fiber 14 depends not only on the optical signal being within the wavelength range of the channel, but also on how close the wavelength of the optical signal is to the center wavelength of the channel. For a WDM channel with minimum attenuation at the channel center wavelength, the optical signal, after passing through the WDM, will be strongest at the center wavelength, and will be more attenuated within the channel as the wavelength from the optical signal moves further from center wavelength. Although it will be understood that different wavelength division multiplexers may have different channel shapes, in an exemplary embodiment the channel shape may be a Gaussian shape.

Figure 2:
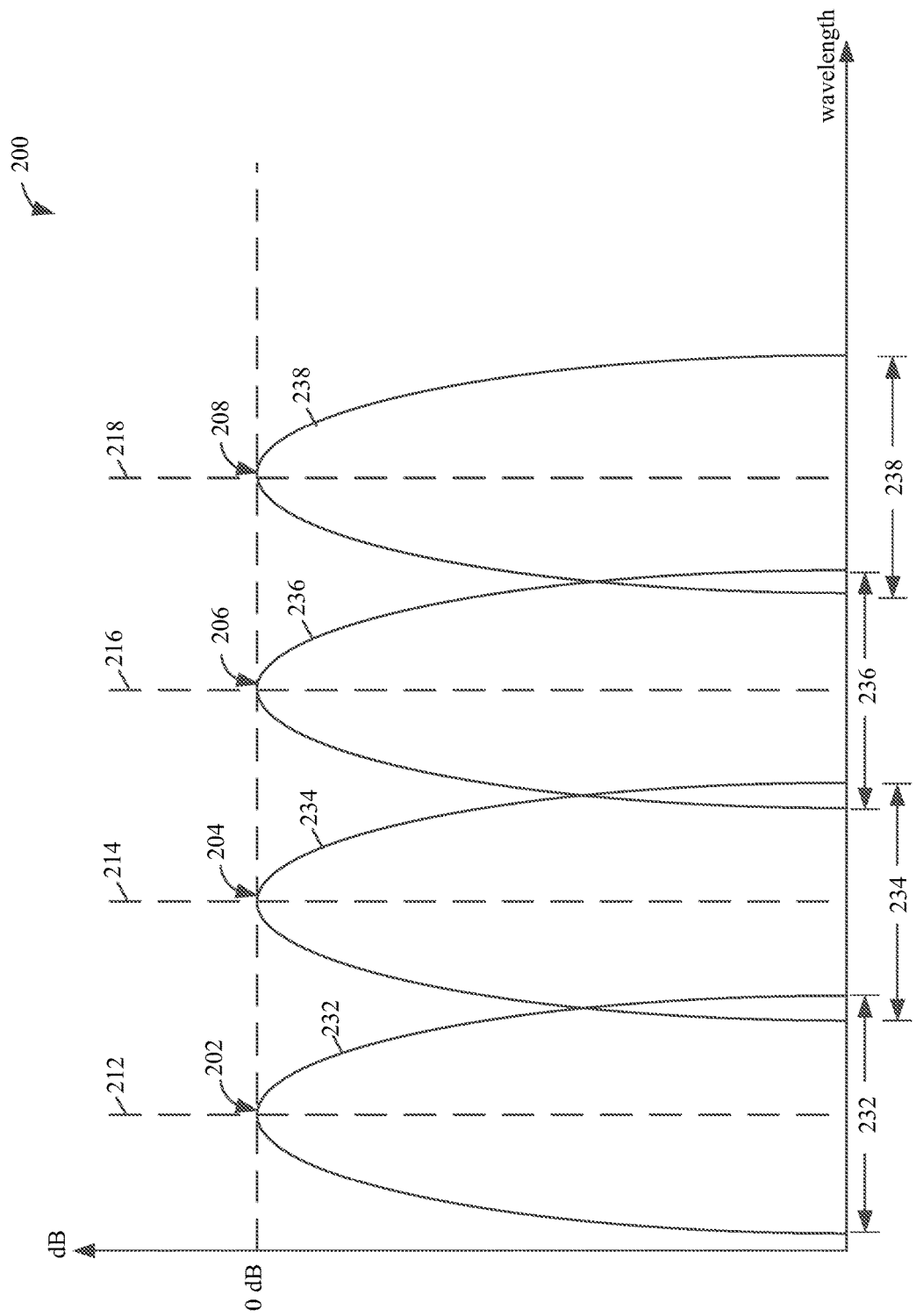
FIG. 2 is an illustration of exemplary Gaussian shaped channels for a wavelength division multiplexer, such as is depicted by FIG. 1.

FIG. 2 depicts attenuation (power loss) versus wavelength for an exemplary wavelength division multiplexer such as wavelength division multiplexer 13 in FIG. 1 with Gaussian shaped channels. FIG. 2 depicts an example of four channels 202, 204, 206, and 208. In the context of the exemplary embodiment described herein, the channel spacing, or distance between center wavelengths of adjacent channels may be about 100 GHz (approximately 0.8 nm). The four depicted channels of FIG. 2 may be a subset of the 24 total channels. In other embodiments, other channel numbers and spacings may be used. The abscissa of FIG. 2 may be in wavelength, while the ordinate may be in decibels (dB). The peak transmitted power of the optical signal is referred to herein as the "zero dB point", which corresponds to the center wavelength 212, 214, 216, and 218 associated with each of the four channels 202, 204, 206, and 208. The transmitted power of the optical signal may attenuate as the optical signal departs from the center wavelength within the channel, as depicted by Gaussian channel passbands 232, 234, 236, and 238. Note that the WDM 13 may be configured such that each optical fiber 12 is associated with a single respective channel 202, 204, 206, or 208 and blocks light at wavelengths outside of the associated channel. For example, for a local fiber 12 associated with channel 202, the WDM 13 permits wavelengths within the passband 232 to pass while blocking wavelengths outside of the passband 232, including blocking wavelengths that are within portions of the passbands 234, 236, and 238 that do not overlap with the passband 232. That is, for the fiber 12 associated with passband 232, wavelengths of light from the fiber 12 within passbands 234, 236, and 238 are blocked. These passbands 234, 236, and 238 allow light from other local fibers 12 to pass.

Figure 3:
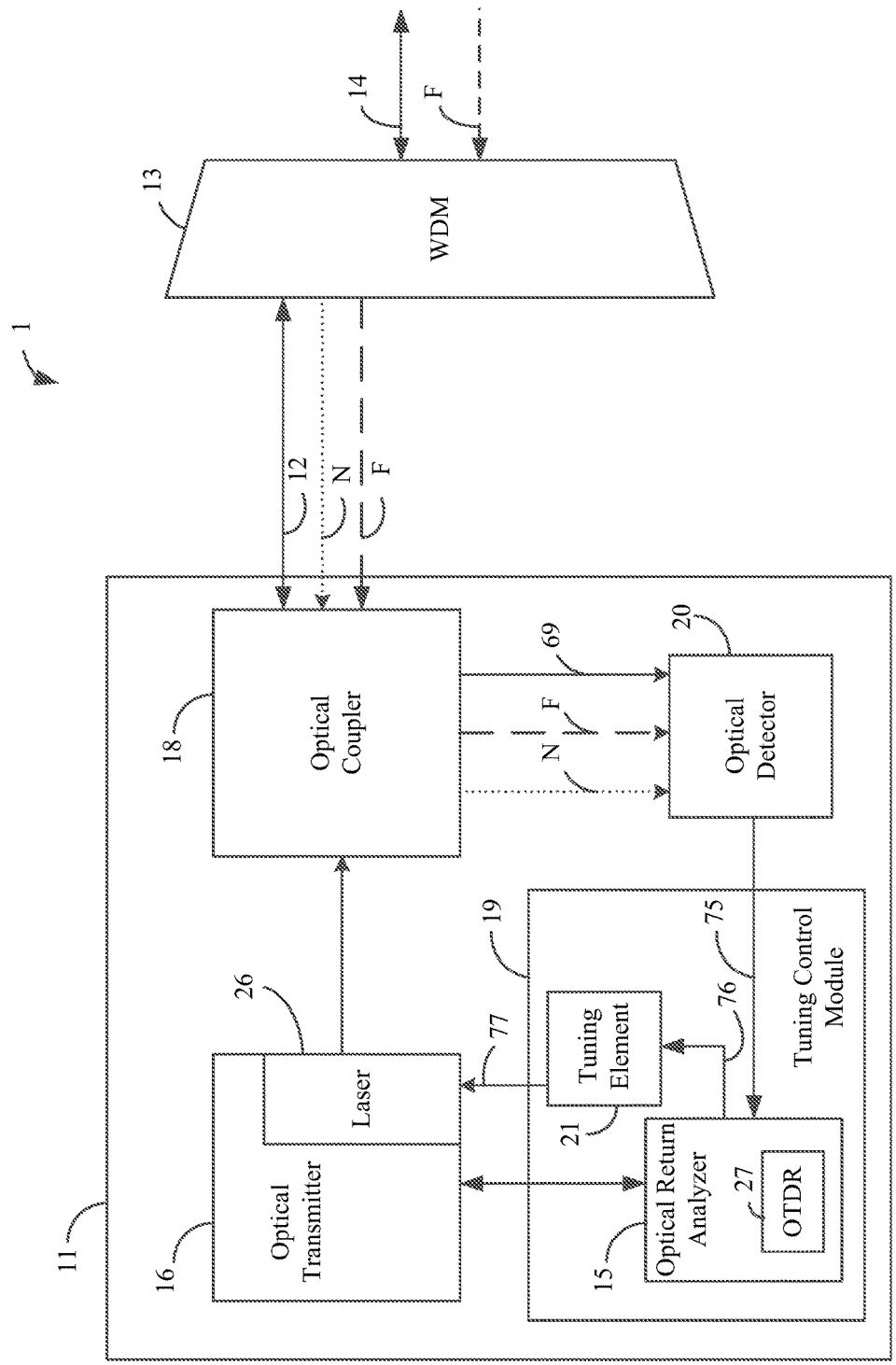
FIG. 3 is a block diagram illustrating an exemplary embodiment of an optical transmission system including an optical time-domain reflectometer for use in tuning a tunable laser.

FIG. 3 is a block diagram illustrating an exemplary embodiment of an optical transmission system 11, including a tuning control module 19 for use in tuning tunable laser 26. Although a single optical transmission system 11 is depicted in FIG. 3, it will be understood that the same or similar optical transmission systems 11-11n may be coupled to local fibers 12-12n, each of which is associated with a channel of wavelength division multiplexer 13. Optical transmission system 11 includes an optical transmitter 16 including laser 26, an optical coupler 18 (e.g., a directional coupler), an optical detector 20, and a tuning control module 19, which may include an optical return analyzer 15 and a tuning element 21, as shown by FIG. 3. Optical transmitter 16 may generate or otherwise provide electrical signals for driving the laser 26, which produces optical signals that are transmitted over the optical path 1. In this regard, the optical transmitter 16 modulates an electrical signal with incoming data to be transmitted over the optical path to a remote receiver.

When the laser 26 is to be tuned by the tuning control module 19, the laser 26 may be configured to transmit any of various types of signals for use in the tuning process. As an example, the laser 26 may transmit pulses. In another example, such as when the tuning control module 19 includes an optical time domain reflectometer (OTDR), as will be described in more detail below, optical transmitter 16 may transmit OTDR signals. For example, optical transmitter 16 may be in communication with the OTDR and may drive the laser 26 with an electrical signal, such as a pulse or a correlation sequence, to produce an optical signal that is usable by the OTDR. In some embodiments, the optical transmitter 16 may transmit both data and OTDR signals at the same time over the same optical path, such as by modulating a data signal with a correlation sequence, as is described in commonly-owned U.S. Pat. No. 8,606,117, which is incorporated by reference herein in its entirety. Various other types of signals may be transmitted by the laser 26 in other embodiments.

The transmitted signal from laser 26 may be provided to the optical coupler 18, which allows the optical signal from laser 26 to pass to local optical fiber 12. In one embodiment, the optical coupler 18 is implemented as a directional coupler that directs the optical signal from the laser 26 to the fiber 12 and that directs optical signals from the fiber 12 to the optical detector 20. The optical signal from the laser 26 has a wavelength and is associated with a particular channel of the wavelength division multiplexer 13. This transmitted optical signal is multiplexed onto the main optical fiber 14, with a percentage of the power of the optical signal from laser 26 based on how well the wavelength of the signal matches the center wavelength of the associated channel of wavelength division multiplexer 13.

Both the local optical fiber 12 and the main optical fiber 14 of optical path 1 will reflect some portion of the transmitted signal. In FIG. 3, reflections that correspond to the local optical fiber 12 are represented by the dotted line "N" with an arrow pointing in the direction of the reflected optical signal. The reflections "F" corresponding to the main optical fiber 14 represent reflections from the portion of the transmitted optical signal that has passed through the wavelength division multiplexer 13. The reflections N associated with local optical fiber 12 include reflections from the entire transmitted optical signal without attenuation from the wavelength division multiplexer 13 while the reflections F include only reflections from the portion of the transmitted optical signal beyond the wavelength division multiplexer 13 attenuated by the loss of the wavelength division multiplexor 13 and the main fiber 14. Thus, there will be a magnitude step change between the reflections N as compared to the reflections F, with this change evidencing the attenuation caused by the channel of the wavelength division multiplexer 13. The closer the wavelength of the transmitted optical signal is to the center wavelength of the channel of wavelength division multiplexer 13, the smaller is that step change.

The reflections N and the reflections F are directed by optical coupler 18 to optical detector 20, and are collectively referred to as the reflected optical signal 69. Optical detector 20 converts the reflected optical signal 69 into digital samples 75 which are provided to an optical return analyzer 15. Although it will be understood that optical detector 20 may convert the reflected optical signal 69 into digital samples 75 in any suitable manner, in one embodiment, optical detector 20 may include an avalanche photo detector, a transimpedance amplifier, one or more gain elements, and an analog-to-digital converter. The avalanche photo detector and transimpedance amplifier may produce an analog reflection signal based on the reflected optical signal 69, a gain may be applied to the analog reflection signal by the gain element, and the analog-to-digital converter may convert the gain-enhanced analog reflection signal into the digital samples 75.

The optical return analyzer 15 is configured to receive and analyze the digital samples 75 indicative of the reflected optical signal 69 and to provide to the tuning element 21 a value 76, referred to hereafter as "return power value," indicative of at least an amount of optical power reflected from one or more points from the main fiber 14 (i.e., one or more points along the optical path 1 beyond the WDM 13). Thus, the return power value 76 from the optical return analyzer depends on the attenuation of the WDM 13. In one embodiment, the return power value 76 is greater as the attenuation from the WDM 13 decreases. As an example, the return power value 76 may be at a maximum when the wavelength of the laser 26 is precisely tuned to the center wavelength of its associated channel 12. In other embodiments, other relationships between the return power value 76 and the attenuation of the WDM 13 are possible. Tuning element 21 is configured to modify the tuning value 77 that is provided to laser 26 based on the return power value 76 from the optical return analyzer 15.

In one embodiment, as shown by FIG. 3, the optical return analyzer 15 comprises an optical time domain reflectometer (OTDR) 27 for assisting with the determination of the tuning value 77. In general, OTDRs provide information regarding reflections of a transmitted optical signal and are often used for detecting anomalies in optical fibers. One type of OTDR transmits a pulse along an optical path. A portion of the light of the pulse is reflected toward the transmitter from each point along the optical path. As will be well known to those skilled in the art, such returns are produced by scattering of the light (Rayleigh backscatter) all along length of the fiber and in some cases by localized reflections (Fresnel reflections) at particular points along the optical path. Herein, both these sorts of optical signal returns are collectively referred to as reflections. The OTDR measures the light returned from points along the length of the optical path. Changes in the reflected light over the length of the optical path correspond to locations where the optical signal has been changed or attenuated. These changes may be used to identify anomalies, or as described herein, characteristics of equipment such as a wavelength division multiplexer.

The OTDR 27 of FIG. 3 can estimate the location of components or anomalies within the optical path 1 based on reflection delays associated with changes in the reflected signal. In this regard, each point along an optical path corresponds to a particular delay measured from the time of transmission. That is, the further the location of a reflection is from the OTDR 27, the longer it will take for a transmitted pulse to reach the location, reflect, and return to the OTDR 27. OTDR 27 is able to measure the amount of delay between transmission of a signal from optical transmitter 16 and reception of a reflection at optical detector 20. This delay corresponds to the optical path distance of the location from the OTDR 27, and the OTDR 27 can estimate this distance based on such delay.

Although it will be understood that any suitable OTDR 27 may be used in accordance with the present disclosure, in one embodiment the OTDR 27 may be a correlation OTDR. In a correlation OTDR, a correlation sequence, such as a pseudo noise (PN) sequence, is transmitted along the optical fiber instead of a pulse. The digital samples representing the PN sequence that reflects from the optical path 1 are correlated with a delayed digital version of the transmitted PN sequence. In this regard, the reflected PN sequence and delayed PN sequence are input into a bank of correlators for which each correlator corresponds to a discrete delay and, hence, location on the fiber. The delayed PN sequence is stepped through a delay line, and for each step, each correlator correlates (e.g., multiplies and accumulates) a respective value of the delayed PN sequence with the value of the reflected PN sequence currently received from the fiber, thereby outputting a correlation value indicating to what degree the two inputs match.

The delay in the delay line is controlled such that a given correlator receives a value of the delayed PN sequence when a reflection of that value would be received from the fiber location corresponding to the correlator. Accordingly, PN sequence values received from fiber locations with delays that do not correspond to a given correlator vary relative to the values from the delayed PN sequence such that the correlation values are substantially canceled by the accumulation process. However, reflected PN sequence values received from the location with a delay which does correspond to that correlator respectively match the values from the delayed PN sequence such that the correlation values accumulate to a significant number over time.

Therefore, each correlator provides an output indicative of the light reflected from a given point on the fiber and substantially independent of light reflected from other locations along the fiber. If a correlator provides an output value which is significantly different from the value that would be expected for the fiber, then it can be determined that an anomaly or component that affects light transmission, such as a WDM, likely exists at or close to the fiber location corresponding to the correlator. As an example, if a large step change between adjacent correlators is detected, this may be indicative of a wavelength division multiplexer at or close to a location associated with one or more of the adjacent correlators, as described herein.

As will be described hereafter, the OTDR 27 generates correlation values that correspond to the strength of the reflections at particular locations along the optical path, each correlator being associated with a particular location along the optical path 1. Correlator values, also referred to herein as "OTDR values," may be analyzed by the optical return analyzer 15 in order to estimate an amount of optical power received from points along the main fiber 14 over a given time period and to then provide a signal indicative of this estimate to tuning element 21. As an example, the optical return analyzer 15 may be configured to sum OTDR values from correlators associated with points at least beyond the WDM 13 relative to the optical transmitter 16 (i.e., points along the optical path 1 on a side of the WDM 13 opposite to the optical transmitter 16 such that light from the optical transmitter 16 passes through the WDM 13 to reach such points), as will be described in more detail below. The OTDR 27 may also be in communication with optical transmitter 16, for example, in order to receive a delayed version of the PN sequence that is transmitted from the optical transmitter 16.

Because the OTDR values are associated with locations of the optical path 1, a first subset of the OTDR values will be associated with reflected signal N from local fiber 12. Similarly, a second subset of OTDR values will be associated with reflected signal F from locations along main fiber 14. The OTDR values may be used to define the return power value 76 and thereby used to provide tuning control for laser 26. In some embodiments, tuning element 21 may control the wavelength of laser 26 in order to identify the location of wavelength division multiplexer 13 along the optical path 1. In embodiments in which tuning control module 19 seeks to identify the location of wavelength division multiplexer 13, OTDR values from both the first subset of OTDR values associated with local optical fibers 12 and the second subset of OTDR values associated with main optical fiber 14 may be used. Because the reflections N and reflections F can be expected to have different properties, particularly when the wavelength of the transmitted optical signal is not within the passband of the WDM channel associated with the local fiber 12, these properties can be used to identify the location of the wavelength division multiplexer.

In addition, the optical return analyzer 15 can use the second subset of OTDR values associated with reflections F from main fiber 14 for defining the return power value 76 in order to provide tuning control to laser 26. That is, the optical return analyzer 15, for the purposes of calculating the return power value 76, may separate the reflections F from the reflections N and use the OTDR values from the reflections F ignoring the reflections N. By focusing solely on the second subset of OTDR values associated with delays corresponding to the main fiber 14 when defining the return power value 76, the optical return analyzer 15 is able to ignore reflections N that may obscure the contributions of reflections F to the overall reflected optical signal 69. Because the reflections F from main optical fiber 14 are from the portion of the transmitted optical signal that passed through the channel of wavelength division multiplexer 13, changes in the OTDR values associated with the main optical fiber 14 (i.e., the second set of OTDR values) are reflective of changes in the wavelength of the transmitted optical signal relative to the center wavelength of the associated channel of wavelength division multiplexer 13. These techniques for identifying the location of the wavelength division multiplexer 13 and tuning the wavelength of laser 26 based on the second set of OTDR values (i.e., associated with the main optical fiber 14) may be collectively referred to as range gating.

The use of the OTDR values for defining the return power value 76 is based on feedback of how much of the transmitted optical signal passes through the associated channel of the wavelength division multiplexer 13 to the main optical fiber 14. Thus, if the wavelength of the transmitted optical signal from laser 26 varies over time (e.g., due to laser temperature or drift over time), or if the characteristics of the wavelength division multiplexer 13 or optical path 1 change, these changes can be identified and compensated for based on real-time feedback of the actual operating conditions for the optical transmission system 11 and the optical path 1.

Figure 4A:
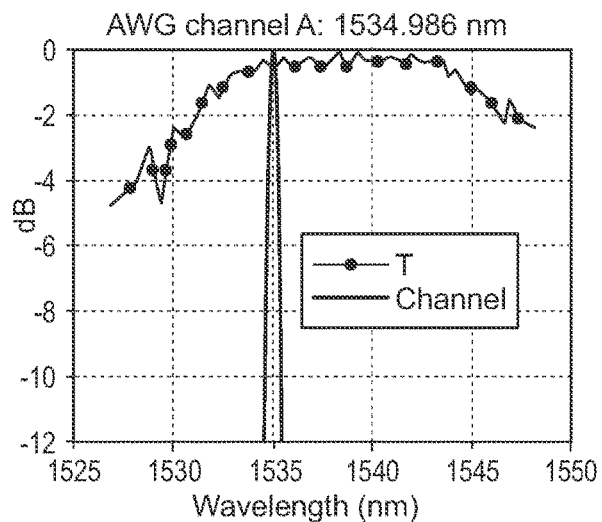
FIG. 4A is an illustration of an exemplary reflected signal over a range of wavelengths, including a wavelength associated with a first channel of a wavelength division multiplexer.
Figure 4B:
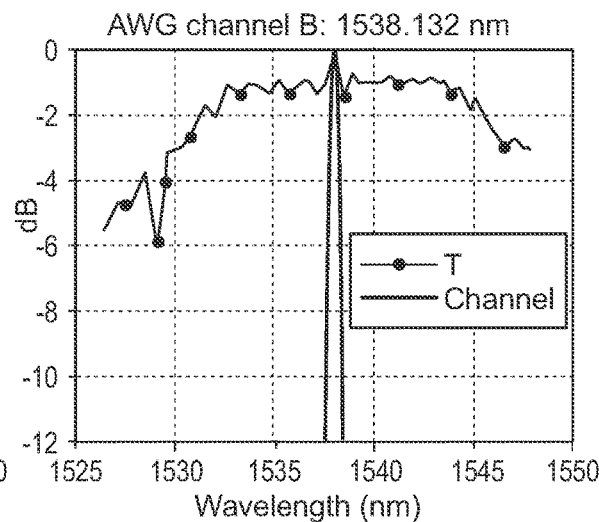
FIG. 4B is an illustration of an exemplary reflected signal over a range of wavelengths, including a wavelength associated with a second channel of the wavelength division multiplexer of FIG. 4A.
Figure 4C:
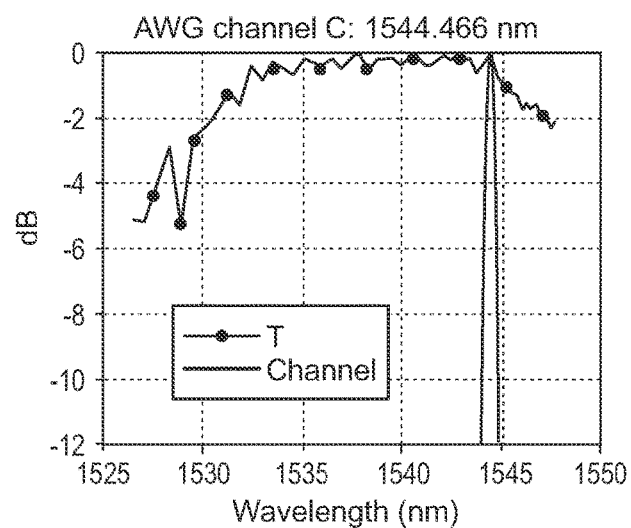
FIG. 4C is an illustration of an exemplary reflected signal over a range of wavelengths, including a wavelength associated with a third channel of the wavelength division multiplexer of FIG. 4A.

FIGS. 4A-4C are illustrations of an exemplary reflected signal over a range of wavelengths including, for each of FIGS. 4A-4C, a wavelength associated with a respective channel of wavelength division multiplexer 13. FIGS. 4A-4C show the total backscatter return signal, T, where T=F+N. The plots have been normalized relative to max T for the respective measurements. The dotted line for each of FIG. 4A-4C represents a reflected signal that includes reflections from the entire optical path (e.g., reflections N and reflections F). In each of FIGS. 4A-4C, tunable laser 26 is associated with a particular channel, including a channel "A" for FIG. 4A, a channel "B" for FIG. 4B, and a channel "C" for FIG. 4C. These channels and their Gaussian passbands are depicted by solid lines.

As is depicted in each of FIGS. 4A-4C, the passband of each channel is relatively narrow (e.g., about 0.8 nm). A tunable laser was stepped through the entire range of wavelengths for the wavelength division multiplexer 13 (e.g., a wavelength range of about 1,527 nm to about 1,548 nm). As can be seen in each of FIGS. 4A-4C, the reflected optical signal is not appreciably different at the wavelength associated with the channel of the wavelength division multiplexer 13. Such a reflected optical signal is of limited usefulness for laser tuning.

Figure 5A:
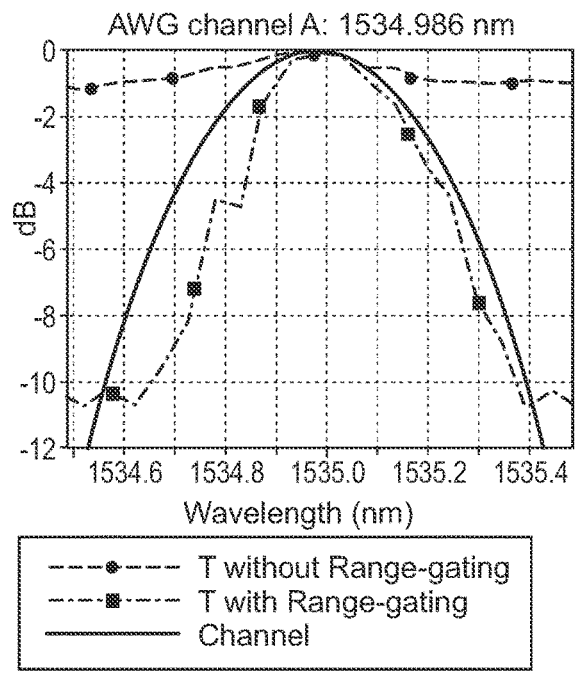
FIG. 5A is an illustration of an exemplary reflected signal and an exemplary range-gated reflected signal over a wavelength range associated with a first channel of a wavelength division multiplexer.
Figure 5B:
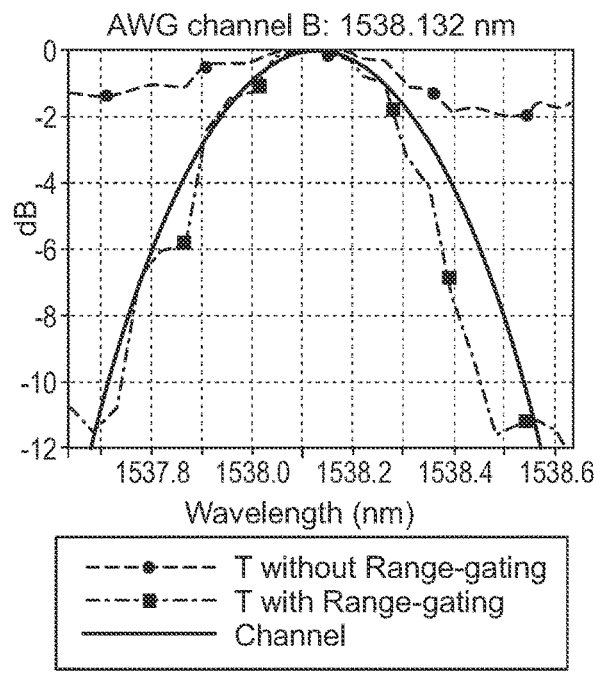
FIG. 5B is an illustration of an exemplary reflected signal and an exemplary range-gated reflected signal over a wavelength range associated with a second channel of the wavelength division multiplexer of FIG. 5A.
Figure 5C:
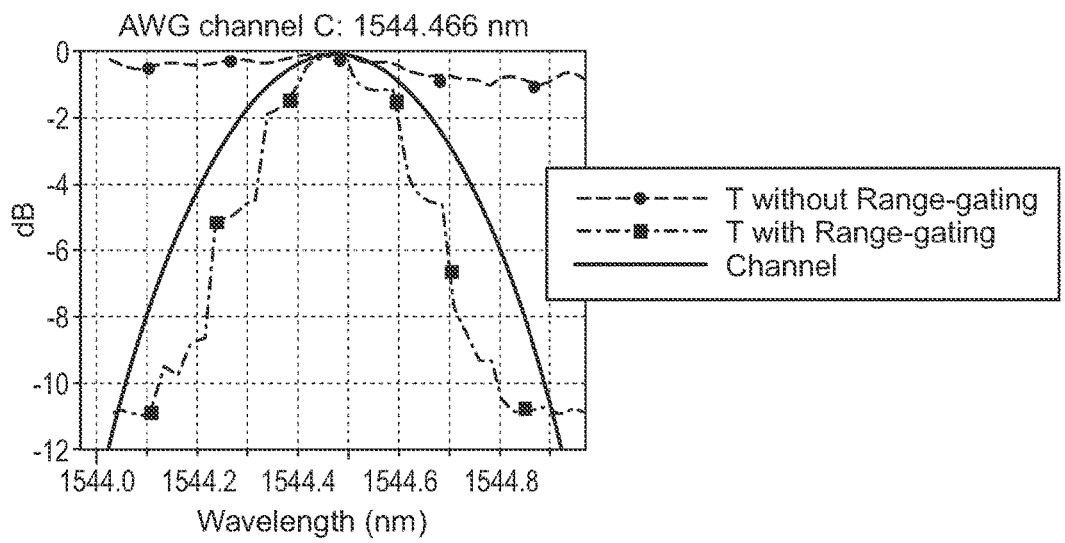
FIG. 5C is an illustration of an exemplary reflected signal and an exemplary range-gated reflected signal over a wavelength range associated with a third channel of the wavelength division multiplexer of FIG. 5A.

FIGS. 5A-5C are illustrations of an exemplary reflected signal and an exemplary range-gated reflected signal over a range of wavelengths associated with a particular channel of wavelength division multiplexer 13. FIG. 5A depicts a wavelength range associated with a channel "A", FIG. 5B depicts a wavelength range associated with another channel "B", and FIG. 5C depicts a wavelength range associated with yet another channel "C". Each of FIGS. 5A-5C includes three plots. For each of FIGS. 5A-5C, the ideal Gaussian channel shape for the attenuation of the channel is depicted with a solid line, the reflections associated with only the main optical fiber 14 (e.g., only reflections F) are depicted with the square dotted line, and the reflections from the entire optical path 1 (e.g., including reflections N from a local optical fiber 12) are depicted with a circle-dotted line. A tunable laser was stepped through the entire channel of the wavelength division multiplexer 13. However, as can be seen from FIGS. 5A-5C, when range-gating is introduced (e.g., when only the reflections F from the main optical fiber 14 are used for tuning the laser 26), the received reflections that are used by tuning control module 19 to provide a tuning value 77 to the tunable laser 26 closely track the Gaussian shape of the WDM channels. Similar to FIGS. 4A-4C, when reflections from the entire optical path are used, it can be difficult to identify whether the transmitted optical signal is matched to the center wavelength of the WDM channel.

Figure 6:
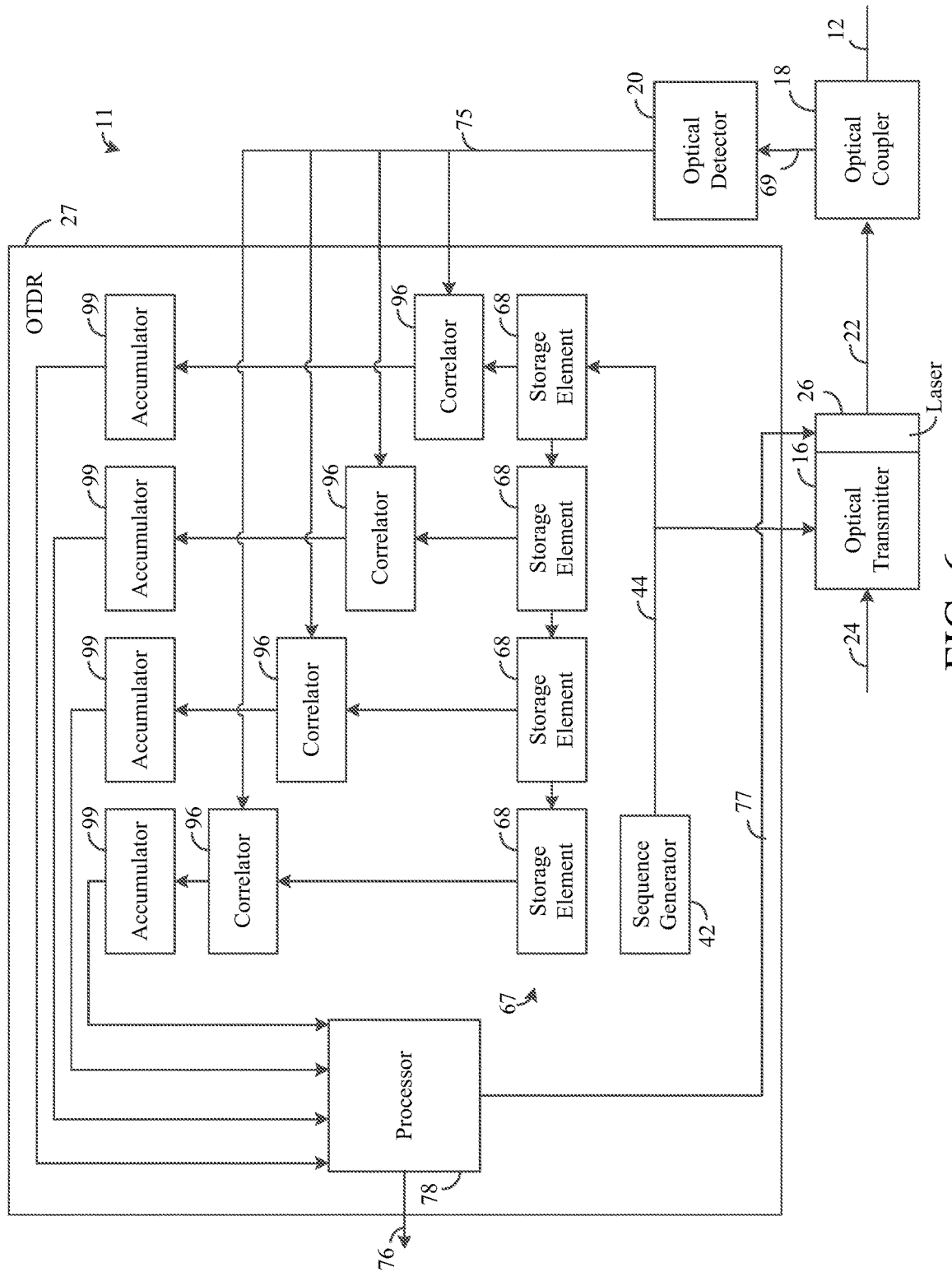
FIG. 6 is a block diagram illustrating an exemplary embodiment of an optical transmission system including an optical time-domain reflectometer for use in tuning a tunable laser.

FIG. 6 depicts an exemplary embodiment of an optical transmission system 11 that employs an OTDR 27, as generally shown by FIG. 3. Although any suitable OTDR may be used in accordance with the present embodiments, in one embodiment the OTDR 27 may be a correlation OTDR. As shown by FIG. 6, the OTDR 27 comprises a sequence generator 42 that generates a digital data sequence 44. In one exemplary embodiment, the data sequence 44 is a PN sequence, such as an M-sequence. As is known in the art, an M-sequence has correlation properties that generally make this type of sequence preferred for many applications. However, other types of digital data sequences, such as a random data sequence, may be used in other embodiments. For illustrative purposes, it will be assumed hereafter that the digital data sequence 44 is a PN sequence and, more specifically, an M-sequence.

The optical transmission system 11 also includes an optical transmitter 16 that is configured to transmit an optical data signal 22 across a local optical fiber 12. The optical data signal 22 may be generated by laser 26 of optical transmitter 16. The optical data signal may be generated based on a received digital data signal 24, an OTDR signal generated based on a digital data sequence 44, or a combination thereof, for example, as is described in commonly-owned U.S. Pat. No. 8,606,117, which is incorporated by reference herein in its entirety. The optical transmitter 16 is also coupled to an optical coupler 18 (such as a directional coupler) that is coupled to the local optical fiber 12, as shown by FIG. 6. The laser 26 of optical transmitter 16 converts the received data signal 24 and/or the digital data sequence 44 to an optical data signal 22 that is transmitted through the optical coupler 18 to the local optical fiber 12, which carries the optical signal to an optical receiver at a remote location via local optical fiber 12, wavelength division multiplexer 13, and main optical fiber 14.

Sequence generator 42 is also coupled to a delay line 67 through which the digital data sequence 44 is serially shifted. In this regard, the delay line 67 has a plurality of storage elements 68, and each storage element 68 stores a respective value (e.g., +1 or −1) of the digital data sequence 44 as it is being shifted through the delay line 67. In other embodiments, other types of values for the digital data sequence 44 are possible.

During transmission, portions of the optical signal 22 reflect back toward the optical transmission system 11 as it travels along the optical path 1, including local optical fiber 12, wavelength division multiplexer 13, and main optical fiber 14. The amplitude of the reflected optical signal at each location is affected by normal backscattering and by line anomalies, such as degraded splices. The optical coupler 18 receives from the optical fiber 12 a reflected optical signal 69, comprising the reflections of the optical signal 22 as it travels along the optical path 1. The optical coupler 18 provides the reflected optical signal 69 to optical detector 20, which outputs digital samples 75 defining a sequence of digital values that are representative of the optical signal 69 and that are provided to correlators 96. In one exemplary embodiment, the digital samples 75 are serially transmitted at the same frequency as the digital data sequence 44, but other frequencies are possible in other embodiments.

The digital samples 75 recovered by the optical detector 20 are transmitted to a plurality of correlators 96. Each correlator 96 corresponds to a respective location along the optical path 1. In this regard, for a given correlator 96, there is a finite delay from the time that a value of the digital data sequence 44 is transmitted by the optical transmitter 16 until the value is shifted into the storage element 68 that is coupled to the correlator 96. Further, each point along the optical path has a reflection delay that is based on the point's distance from the optical transmitter 16. As used herein, a point's "reflection delay" is the amount of time for a sample to travel from the optical transmitter 16 to the point, return to the detector, and reach the correlator 96. Generally, the further the point is from the optical transmitter 16, the greater is the point's reflection delay. Moreover, the location corresponding to the correlator 96 is that location where the reflection delay is equal to the correlator's sequence delay.

The correlators 96 are respectively coupled to the storage elements 68 of the delay line 67, as shown by FIG. 6. Each correlator 96 correlates (e.g., multiplies and accumulates) successive digital samples 75 with values stored in a respective one of the storage elements 68. In other embodiments, other types of correlations are possible. Samples indicative of reflections from a correlator's corresponding fiber location tend to accumulate over time whereas samples of reflections from other locations tend to cancel. Thus, each correlator value generally represents a measurement of the amount of light that reflects from the corresponding fiber location over time. As shown by FIG. 6, the output of each correlator 96 may be further accumulated by a respective accumulator 99 (if provided in the OTDR 27). The OTDR 27, including correlators 96 and accumulators 99 may function in a manner as described in commonly-owned U.S. Pat. No. 8,606,117, which is incorporated by reference herein in its entirety.

The accumulated correlation values are transmitted to a processor 78 that analyzes the correlation values and provides a return power value 76 to be used by the tuning element 21 (not shown in FIG. 6) for tuning the laser 26. As an example, for a given sample, the processor 78 may sum the correlation values from the correlators 96 associated with points along the main fiber 14 such that the sum is indicative of the total amount of optical power from the laser 26 that passes through the WDM 13 (FIG. 3), reflects from the main fiber 14, and is detected by the optical detector 20.

The processor 78 may transmit the sum as a return power value 76 to the tuning element 21. Such a sum essentially represents a measurement of the total power received by the optical detector 20 from the light reflected from main fiber 14 over the time interval of the sample. In other embodiments, other techniques for estimating the amount of light reflected from the fiber 14 or other points beyond the WDM 13 are possible.

In one exemplary embodiment, the tuning element 21 analyzes multiple measurements from the OTDR 27 in order to determine how to adjust the wavelength of the laser 26 so that it is tuned to the center wavelength of the associated WDM channel for the laser 26. In this regard, the tuning element 21 adjusts the laser's wavelength across a range of wavelengths and, for each of the wavelengths, analyzes the return power value 76 from the OTDR 27 to determine the amount of light reflected from the main fiber 14.

Notably, as described above, the measurement of light from the fiber 14 indicated by the return power value 76 should be at a maximum when the wavelength of the optical signal from the laser 26 is closest to the center wavelength of the associated channel of wavelength division multiplexer 13. That is, the further the laser's wavelength is from the WDM's center wavelength, the more that the WDM 13 attenuates the signal passing through it thereby reducing the amount of light that is reflected from the main fiber 14. In one exemplary embodiment, the tuning element 21 identifies the wavelength that results in the maximum power measurement for the reflections from the fiber 14 and tunes the laser 26 to such wavelength, thereby tuning the laser 26 to a wavelength within a range of the center wavelength of the laser's associated channel of WDM 13 (e.g., close to the center wavelength within a desired tolerance). Exemplary techniques for tuning the laser 16 will be described in more detail below.

Note that, in one exemplary embodiment, the components of the tuning control module 19, including both the OTDR 27 and the tuning element 21, are implemented in hardware (e.g., logic gates and other circuitry). However, in other embodiments, it is possible for various components to be implemented in hardware, software, firmware, or combinations thereof. As an example, the processor 78 may comprise a digital signal processor (DSP) or central processing unit (CPU) having software running on the DSP for implementing its functionality described herein. Note that, if desired, it is possible for other components, such as the tuning element 21, to be implemented in software and executed by the same hardware (e.g., DSP or CPU) that is used to implement the processor 78.

FIGS. 7-11 depict methods for range-gating in order to tune a laser using an OTDR 27. While, for purposes of simplicity of explanation, the methods are shown and described as a series of steps, it is to be understood and appreciated that such illustrations or corresponding descriptions are not limited by the order of the steps, as some steps may occur in different orders and/or concurrently with other steps from what is depicted and described herein. Any non-sequential, or branched, flow illustrated via a flowchart should be understood to indicate that various other branches, flow paths, and orders of the steps, can be implemented which achieve the same or a similar result. Moreover, not all illustrated steps may be required to implement the methods described hereinafter.

Figure 7:
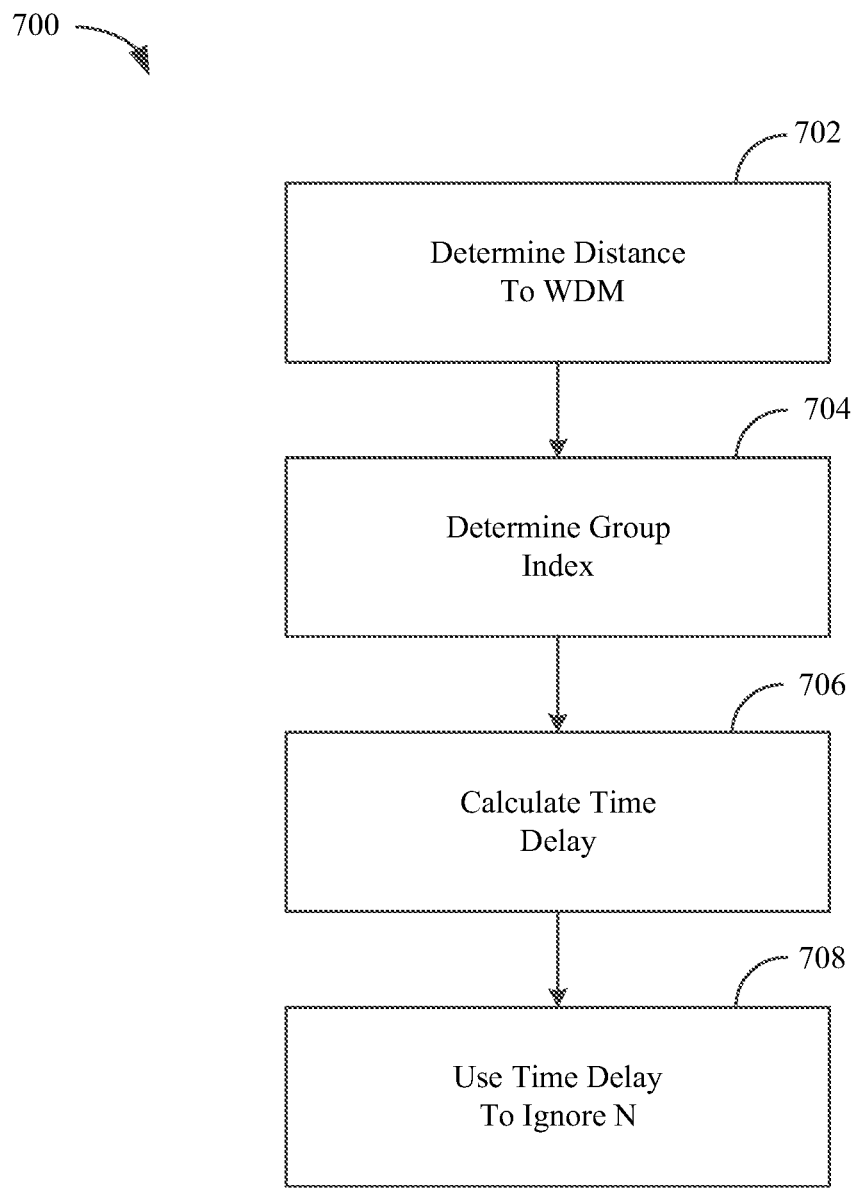
FIG. 7 is a flow chart illustrating an exemplary method of identifying and discarding backscatter noise, N, generated between a transmitter and WDM.

FIG. 7 depicts steps 700 for identifying a reflection delay associated with wavelength division multiplexer 13. In one embodiment, the distance to the wavelength division multiplexer 13 via local fiber 12 may be known, such that it may be possible to calculate a delay associated with the reflections N that are associated with the local fiber 12.

Figure 8:
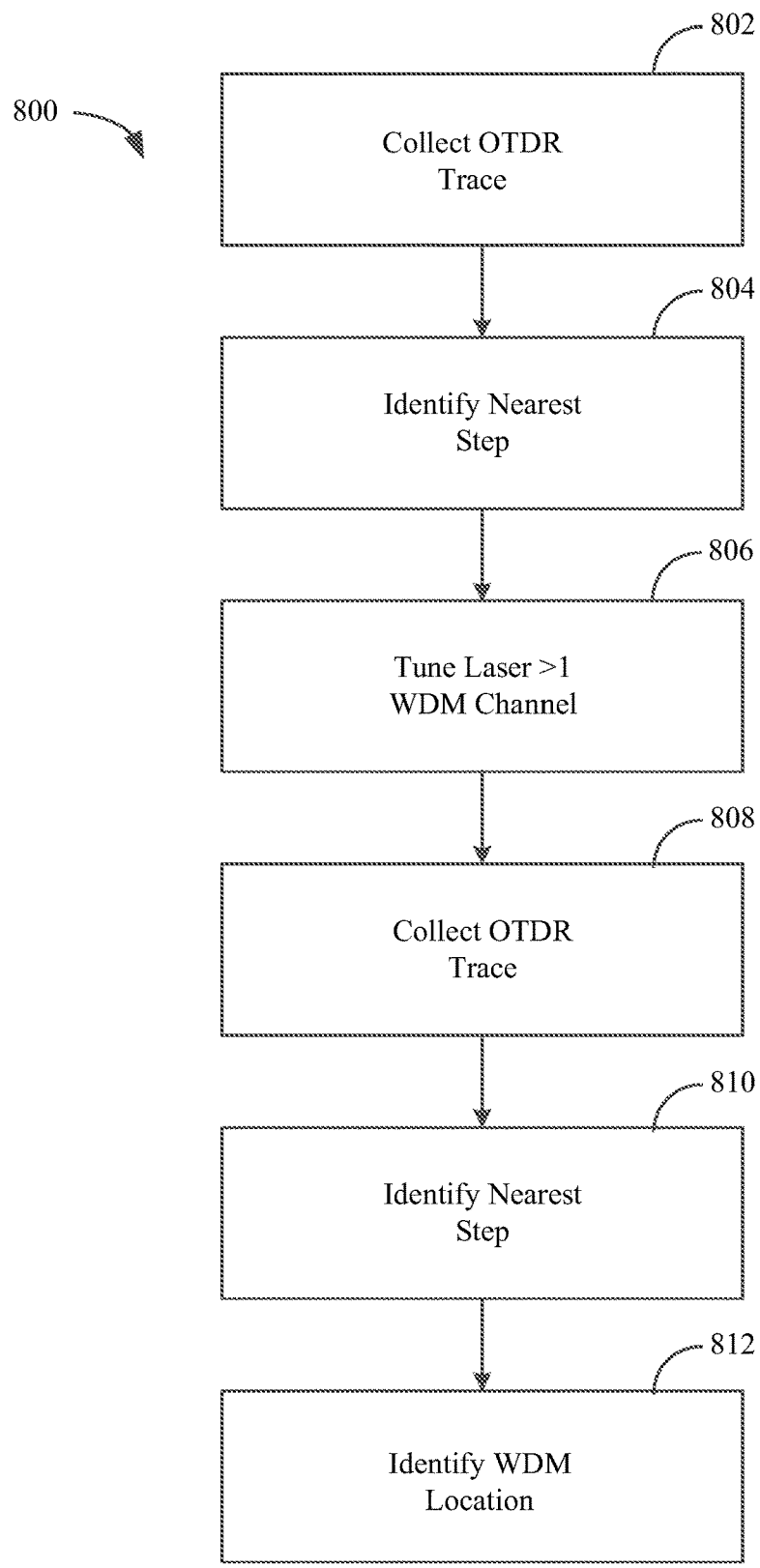
FIG. 8 is a flow chart illustrating an exemplary method of identifying the location of a wavelength division multiplexer in a fiber network.

At step 702, the distance to wavelength division multiplexer 13 may be determined. This distance may be determined in any suitable manner, such as physical measurement, a known amount of local fiber 12 used for any installation, use of the OTDR signal as illustrated in FIG. 8, or any other suitable measurement method. The relationship between distance and the time delay associated with received reflections is known, and is determined according to the following:

$$d = \frac{c}{2n_g}\Delta t$$

where:
$\Delta t$=round-trip time delay for a reflection;
c=speed of light in a vacuum;
d=distance to the wavelength division multiplexer;
$n_g$=refractive group index for the fiber If the distance to wavelength division multiplexer 13 is known, the time delay associated with the reflection N ($\Delta t_N$) can be solved for as follows:

$$\Delta t_N = \frac{2d_N n_g}{c}$$

At step 704, the group index $n_g$ may be determined. Although the group index $n_g$ may be determined in any suitable manner, in some embodiments, the group index may be based on known properties of the local fiber, such as by reading the group index from a fiber datasheet or by calculating the group index using fiber models familiar to those skilled in the art. As noted above, the order of steps shown by the drawings are exemplary and may be rearranged for other embodiments. Indeed, step 704 is not dependent on step 702 and may be performed prior to or in parallel with step 702. Other steps in the figures may be rearranged and performed in different orders as may be desired.

At step 706, the known distance to the wavelength division multiplexer 13, the group index $n_g$, and value for the speed of light c may be used to calculate the time delay $\Delta t_N$ of wavelength division multiplexer 13.

At step 708, the time delay $\Delta t_N$ may be used to ignore reflections that arrive before the time delay $\Delta t_N$, which are associated with the reflections N for locations of local optical fiber 12 prior to wavelength division multiplexer 13. For any suitable OTDR technique (e.g., pulsed, correlation, convolution) or any similar techniques (e.g., optical frequency domain reflectometer (OFDR)), this time delay value $\Delta t_N$ may be used such that only reflections that are received after the time delay $\Delta t_N$ are considered for purposes of range-gating applications. In this manner, only reflections F associated with main optical fiber 14 will be considered.

FIG. 8 depicts steps 800 for automatically identifying a location of a wavelength division multiplexer 13 in accordance with some embodiments of the present disclosure. At step 802, an OTDR trace (referred to hereafter as "first OTDR trace") may be collected for an initial laser tuning value 77 for laser 26. Although an initial laser tuning value 77 may be selected in any suitable manner, in one embodiment the initial laser tuning value 77 may be a tuning value 77 that is expected to correspond to an associated channel of the wavelength division multiplexer 13. The optical signal 22 may then be transmitted down the optical path 1 and may be an OTDR signal, such as a pulse, correlation, or convolution OTDR signal. Whatever OTDR methodology is used, the first OTDR trace may be collected at step 802, thus providing information regarding reflections at different locations along the optical path.

At step 804, the nearest step change in the OTDR values of the trace may be identified. A step change may correspond to a location at which the wavelength division multiplexer 13 is likely to be located, as the wavelength division multiplexer 13 typically results in attenuation of the transmitted optical signal. In one exemplary embodiment, the step change may be a location at which the OTDR values change to a significant degree, such as a raw or percentage threshold change in OTDR values.

At step 806, the tunable laser 26 may receive a tuning value 77 from tuning control module 19 that causes tunable laser 26 to transmit at a wavelength that is greater than one channel away from the original transmission wavelength that resulted in the first OTDR trace. Reflections of the transmitted signal 22 form an OTDR trace, referred to hereafter as the "second OTDR trace," that propagates toward the optical detector 20. Because the wavelength of the transmitted optical signal 22 forming the second OTDR trace is at least one channel away from the prior wavelength, at least one of the OTDR signals transmitted should be outside of the channel of wavelength division multiplexer 13 that is associated with the optical transmission system 11 and local optical fiber 12. As a result, at least one of the traces of the transmitted optical signal 22 should demonstrate a significant attenuation at the location of the wavelength division multiplexer 13.

At step 808, the second OTDR trace is collected. At step 810, the nearest step in the OTDR values of the second OTDR trace may be identified in a similar manner as described above for step 804.

At step 812, the location of the wavelength division multiplexer 13 may be identified based on the nearest step locations of the first and second OTDR traces. As described above, at least one of the collected OTDR traces should correspond to an off-channel wavelength of the transmitted optical signal from the tunable laser 26. Thus, the nearest step identified should correspond to the location of the wavelength division multiplexer 13.

Figure 9:
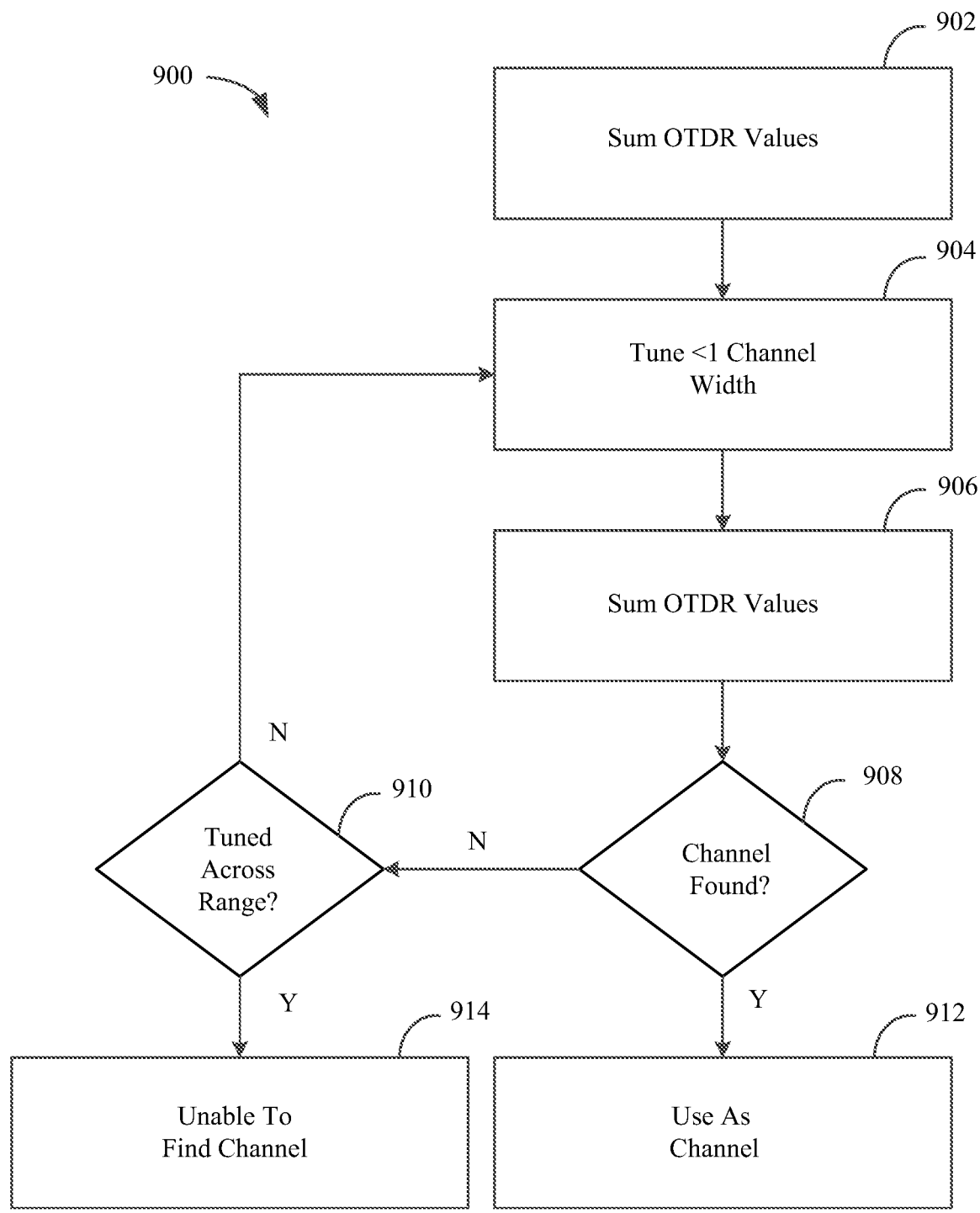
FIG. 9 is a flow chart illustrating an exemplary method the tunable transmitter can use to autonomously find the channel of the wavelength division multiplexer to which it is connected.

FIG. 9 depicts steps 900 for identifying an associated channel of a wavelength division multiplexer 13 in accordance with some embodiments from the disclosure. Steps 900 assume that the location of wavelength division multiplexer 13 is known. At step 902, OTDR values from a collected trace associated with a first tuning value 77 may be summed for locations beyond the wavelength division multiplexer 13 (e.g., associated with main fiber 14). These OTDR values are associated with reflections F that represent the portion of the transmitted optical signal that has passed through wavelength division multiplexer 13 to the main fiber 14.

At step 904, the tuning control module 19 may provide a tuning value 77 to tunable laser 26 that results in a change in the wavelength of the transmitted optical signal that is less than one channel width away from the original channel. For purposes of identifying the associated channel, it is desirable to modify the transmission wavelength by less than one channel width in order to be able to test channels of wavelength division multiplexer 13 without missing any channels. In an exemplary embodiment the wavelength may be tuned by about 25% to 60% of the channel width, but other percentages are possible in other embodiments.

At step 906, a trace associated with the modified tuning value 77 may be collected and the OTDR values for the portion of the second trace that correspond with locations beyond the wavelength division multiplexer 13 (e.g., reflections F from main optical fiber 14) may be summed. Again, these OTDR values may correspond to the portion of the transmitted optical signal that passes through the wavelength division multiplexer 13 to main optical fiber 14.

At step 908, the summed OTDR values determined for each of the tuning values 77 in the preceding steps may be compared to determine whether the wavelength division multiplexer 13 channel has been located. Although this comparison may be performed in any suitable manner, in some embodiments it may be determined that the channel has been found if the difference between the summed OTDR values exceeds a threshold. A larger portion of the optical signal will pass through the channel of the wavelength division multiplexer 13 when the wavelength of the transmitted optical signal from tunable laser 26 is matched to the passband of the channel. Thus, a large difference between the summed OTDR values associated with two different tuning values demonstrates that one of the tuning values likely results in a transmission wavelength that is within the passband of the wavelength division multiplexer 13 channel that is associated with the optical transmission system 11 and local optical fiber 12. If the channel has been found, processing may continue to step 912 where the tuning value 77 associated with the channel may be used as the channel tuning value having a wavelength associated with a channel by tunable laser 26. If the wavelength associated with the channel has not been found, processing may continue to step 910. Note that in other embodiments, other techniques for finding the channel based on the OTDR values or otherwise are possible.

At step 910, it may be determined whether the tuning control module 19 has provided tuning values 77 to tunable laser 26 that cover the entire range of wavelengths that may be transmitted by tunable laser 26. If an optical signal has been transmitted at wavelengths that cover the entire range for the tunable laser 26, processing may continue to step 914 where it is determined that the system is unable to identify an associated channel of the wavelength division multiplexer 13 under the normal criteria. In some embodiments, a tuning value 77 may be selected based on other criteria, for example, based on the tuning value 77 that is associated with the highest sum of OTDR values. If tunable laser 26 has not been tuned across its entire wavelength range, processing may return to step 904, a new tuning value 77 may be provided, and the tunable laser may be tuned to another wavelength value.

Figure 10:
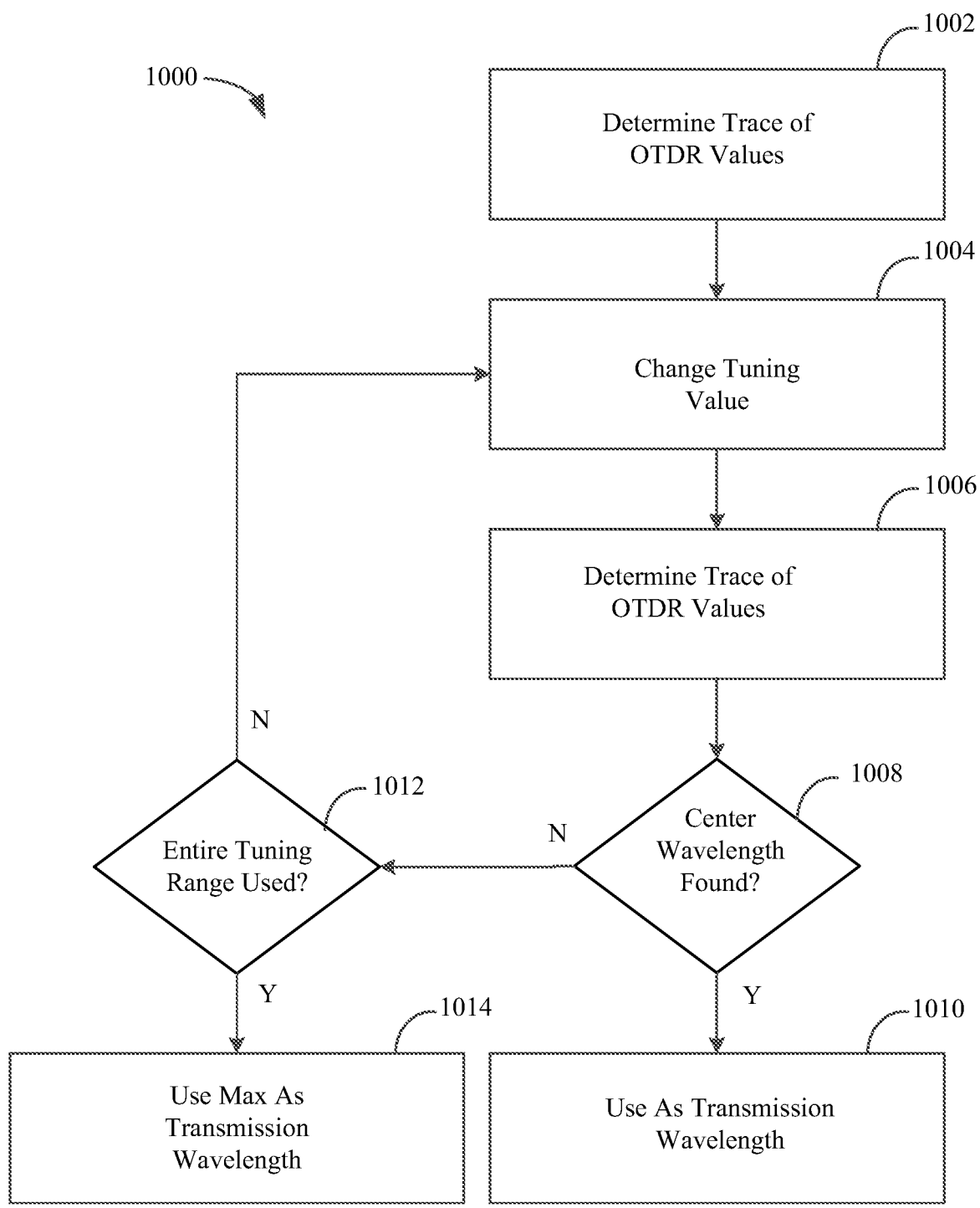
FIG. 10 is a flow chart illustrating an exemplary method a tunable transmitter can use to find the center of the WDM channel to which it is connected.

FIG. 10 depicts steps 1000 for fine tuning the wavelength of tunable laser 26 in an attempt to match the center wavelength of the associated channel of wavelength division multiplexer 13. Prior to performing steps 1000, the channel of the wavelength division multiplexer 13 that is associated with the local fiber 12 and tunable laser 26 may have already been found. At step 1002, a set of OTDR values for a trace of the OTDR return signal 69, referred to hereafter as a "trace" of OTDR values, are calculated and then analyzed.

In this regard, as described above, samples of the return optical signal 69 are detected by the optical detector 20 and correlated by the correlators 96 with a delayed version of the sequence from sequence generator 42 to provide OTDR values, which may be accumulated by the accumulators 99 in order to provide a trace of OTDR values that are transmitted to the processor 78. As described above, each such OTDR value of a given trace corresponds to a specific point along the optical path 1 (which includes the fiber 12 connected to the laser 26, the WDM 13, and the fiber 14) and represents an accumulated measurement of optical returns from that corresponding location.

As described above, the tuning control module 19 uses the OTDR values corresponding to points beyond the WDM 13 in order to control updates to the tuning value 77 that is provided to the tunable laser 26. Thus, the OTDR values used to make an update decision represent measurements of optical returns from points along the fiber 14 beyond the WDM 13.

At step 1004, the tuning value 77 that is provided from tuning control module 19 to tunable laser 26 may be changed, thereby changing the transmission wavelength of the laser 26. Although tuning values 77 may be changed in any suitable manner, in an exemplary embodiment the tuning values 77 may be changed such that the wavelength from the tunable laser 26 varies by only a small portion of the width of a channel of wavelength division multiplexer 13. In one embodiment, the change in the wavelength of the transmitted optical signal may be less than 25% of the wavelength range of the channel of wavelength division multiplexer 13, and in some embodiments, may be less than 10% of the wavelength range of the channel. Tunable laser 26 may transmit an optical signal 22 having the modified wavelength, and the values in the correlators 96 and accumulators 99 may be re-initialized. At step 1006, a new trace of OTDR values is determined, according to the techniques described above for step 1002, and provided to the tuning element 21. This new trace of OTDR values represents OTDR measurements of the returns from the optical signal 22 generated with the tuning value 77 that was updated at step 1004.

At step 1008, it may be determined whether the center wavelength of the channel of the wavelength division multiplexer 13 has been found. This determination may be based on the analysis of the traces of OTDR values 76 calculated from previous steps. Each such trace of OTDR values includes OTDR values corresponding to points along the fiber 14 (beyond the WDM), and these OTDR values represent accumulated measurements of the reflections from such points during a sample period, such as when the tuning value 77 and, hence, transmission wavelength, is set to a specific value. The tuning element 21 may be configured to compare traces of OTDR values in order to find which such trace is at a maximum indicating that the WDM 13 attenuated the transmitted optical signal the least for the tuning value 77 and, therefore, for the transmission wavelength for the trace. For the comparisons, the OTDR values within the same trace may be summed to provide a single value 76 to the tuning element 21, which then compares such value 76 to the sums of other traces. Based on the comparisons, the trace at a maximum is identified, and the tuning value 77 associated with such trace is then selected to tune the laser 26 to the same transmission wavelength that resulted in the maximum OTDR trace. Such transmission wavelength should be at or close to the center wavelength of associated channel of the WDM 13.

Note that there are various techniques that can be used to identify which of the traces of OTDR values is at a maximum. In one embodiment, pattern recognition may be used. In this regard, the OTDR traces may demonstrate a pattern consistent with the passband of the channel (e.g., a Gaussian shape). For example, as OTDR traces are being generated while the tuning value and, therefore, transmission wavelength is being incrementally increased, a peak in the OTDR traces may be identified, and the OTDR traces on each side of the peak may roll off in a recognizable manner. When such pattern is found, the wavelength associated with the OTDR trace closest to the peak may identified as the center wavelength of the WDM channel associated with the laser 26. If it is determined at step 1008 that the center wavelength has been found, processing may continue to step 1010 where the tuning control module 19 tunes the laser 26 to that center wavelength. If the center wavelength is not found at step 1008, processing may continue to step 1012.

At step 1012, it may be determined whether the entire wavelength range associated with a channel has been used. Initially, it may not be known where the current transmission wavelength is located within the passband of the channel of wavelength division multiplexer 13. It may be desirable to both increase and decrease the tuning value 77 and thus the wavelength of the optical signal that is transmitted by tunable laser 26. Once the OTDR traces fall below a certain threshold, it may be determined that the transmitted wavelength is not within the passband of the channel. The transmission wavelength may then be increased or decreased from the initial transmission wavelength to cover the entire tuning range associated with the passband of the channel of the wavelength division multiplexer 13. As long as the entire range associated with the passband of the channel of the wavelength division multiplexer 13 has not been used, processing may continue to step 1004 where tuning value 77 is changed and the checking process is repeated. If the entire tuning range associated with the passband of the channel of wavelength division multiplexer 13 has been used without recognizing a pattern for finding the center wavelength in step 1008, processing may continue to step 1014, where the tuning value 77 that results in the maximum OTDR trace is used as the channel tuning value.

Figure 11:
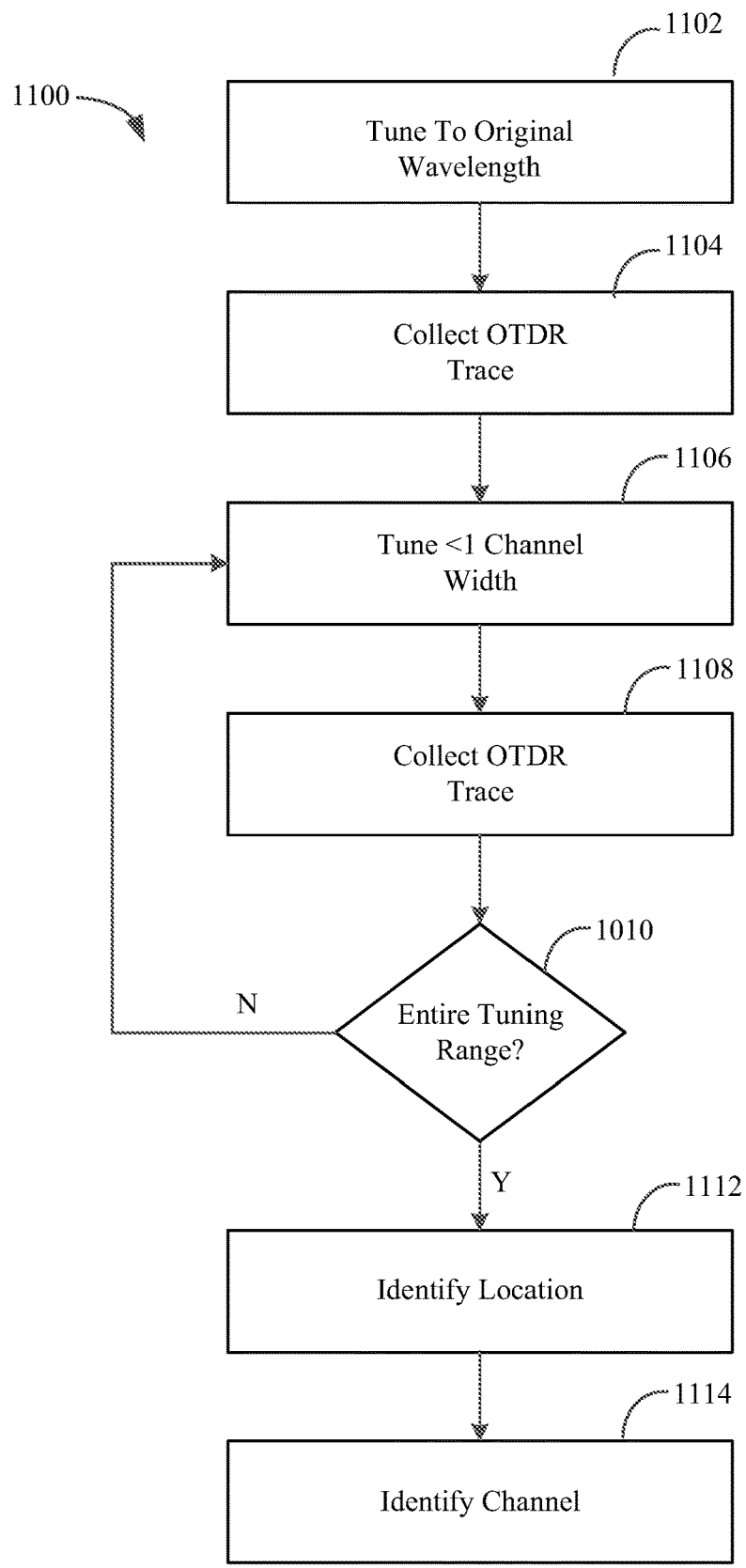
FIG. 11 is a flow chart illustrating steps a tunable transmitter can use to identify the location of a wavelength division multiplexer in a fiber network and find the channel of the wavelength division multiplexer to which it is connected.

FIG. 11 depicts steps 1100 for identifying the location of wavelength division multiplexer 13 and identifying the channel of wavelength division multiplexer 13. In steps 1100, tuning control module 19 may provide tuning values 77 to tunable laser 26 in order to identify the location and channel of wavelength division multiplexer 13.

At step 1102, laser tuning control module 19 may provide a tuning value 77 to tunable laser 26 corresponding to an initial wavelength of the overall tuning range. Although any suitable initial wavelength may be used, in one embodiment the initial wavelength may correspond to the minimum wavelength within the overall wavelength range of the wavelength division multiplexer 13. Tunable laser 26 may transmit an optical signal at the tuned wavelength and the tuning control module 19 may receive reflections as described herein.

At step 1104, a trace of OTDR values may be obtained for the tuning value and the trace may be stored for further processing. Processing may then continue to step 1106.

At step 1106, laser tuning control module 19 may provide a tuning value 77 to tunable laser 26 that adjusts the wavelength of the transmitted optical signal. As described herein, the change in the wavelength of the transmitted optical signal may correspond to less than the width of a single channel. At step 1008, the tunable laser 26 transmits the transmitted optical signal 22 and system 11 receives reflected signals 69, produces digital samples 75 representing reflections 69 and provides OTDR values for the transmitted optical signal. The OTDR values may be used to generate another trace.

At step 1110, it may be determined whether the entire relevant wavelength range of the tunable laser 26, wavelength division multiplexer 13, and/or overlap between the ranges of tunable laser 26 and wavelength division multiplexer 13 have been used. If they have not, processing may continue such that the tunable laser 26 is stepped through the entire relevant wavelength range at steps 1106, 1108, and 1110. If the entire tuning range has been used, processing may continue to step 1112.

At step 1112, the traces for each of the transmitted wavelengths from steps 1002-1110 may be analyzed to identify the location of the wavelength division multiplexer 13. Although it will be understood that the location of the wavelength division multiplexer 13 may be identified in any suitable manner, in one embodiment it may be determined where the nearest point exists at which there is a variance between sequentially collected traces that exceeds a threshold. For example, this greatest variance may occur at a location where the wavelength of the transmitted optical signal changed from a wavelength that was not within the wavelength range of the associated channel of the wavelength division multiplexer 13 to a wavelength that was within the wavelength range of the associated channel of the wavelength division multiplexer 13. Once this location is identified, processing may continue to step 1114.

At step 1114, based on the location identified in 1112, the OTDR values from the collected traces may be summed, but only for those OTDR values 76 that are associated with locations beyond the wavelength division multiplexer 13 (e.g., main optical fiber 14). Based on the summed OTDR values, the channel tuning value may be identified as the tuning value 77 that results in the maximum of the summed values.

Figure 12:
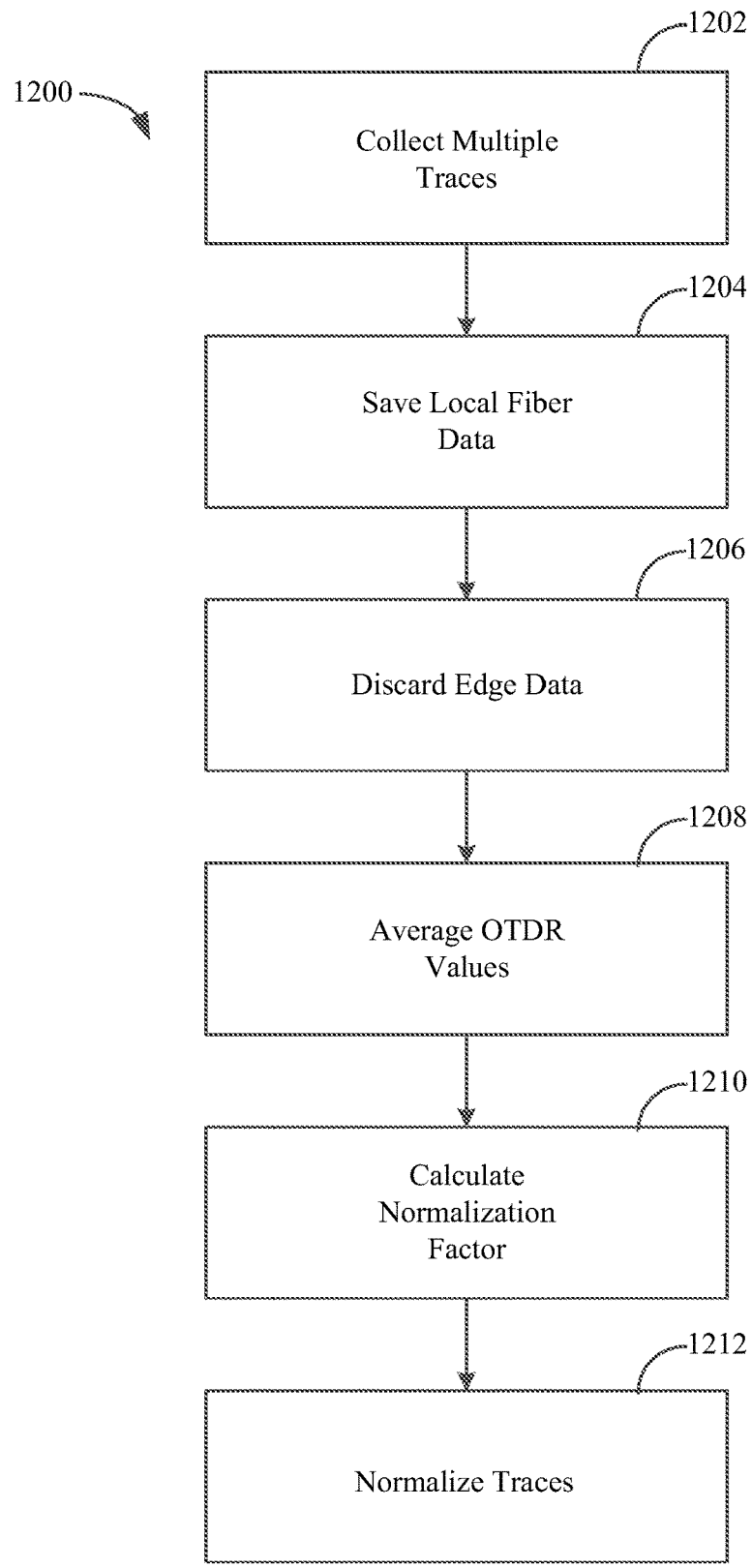
FIG. 12 is a flow chart illustrating an exemplary method of normalizing a reflected signal for use in tuning of a laser.

FIG. 12 depicts steps 1200 for normalizing traces of OTDR values in accordance with some embodiments of this disclosure. System noise such as laser intensity noise of a transmitted optical signal 22 from tunable laser 26 may compromise the accuracy of a single-ended tuning method. In one embodiment, the traces of OTDR values associated with received reflections may be normalized to account for this noise.

At step 1202, multiple traces of OTDR values may be collected and stored for each transmitted wavelength as part of any of the steps described herein. At step 1202, multiple traces of OTDR values associated with local optical fiber 12 may be stored. The locations of the wavelength division multiplexer 13 may be known, and thus the OTDR values associated with the local optical fiber 12 may also be known.

At step 1206, a subset of the OTDR values associated with local optical fiber 12 may be discarded. The discarded values may be associated with the first and last sets of OTDR values (i.e., those OTDR values associated with parts of the optical fiber 12 closest to local optical transmitter 16 and closest to wavelength division multiplexer 13). At step 1208, the resulting subset of OTDR values may be averaged (or otherwise summed or combined) to produce a signal local fiber value $D_{Avg,i}$.

At step 1210, a normalization factor $C_i$ may be calculated for each trace $R_i$. Although the normalization factor may be calculated in any suitable manner, in one embodiment the normalization factor $C_i$ may be calculated based on a known constant normalization value G and the average value $D_{Avg,i}$ determined in step 1208 as follows:

$$C_i = \frac{G}{D_{Avg,i}}$$

At step 1212, each value of each trace of OTDR values 76 may be multiplied by the normalization factor $C_i$ to produce a normalized trace, as follows:

$$R_{i,N}=C_i*R_i$$

The entire trace may then be normalized, for use in the systems and methods as described herein.

In various embodiments described above, the optical return analyzer 15 employs an OTDR 27 for estimating an amount of optical power that is received from points beyond the WDM 14 or other optical component that attenuates signals. It should be noted that such an OTDR 27 is unnecessary. As an example, in one embodiment, the laser 26 may be configured to transmit pulses during a process for tuning the laser 26 to a desired wavelength. If the delay corresponding to reflections from the WDM 13 is known, then the analyzer 27 may be configured to listen for reflections from the main fiber 14 while ignoring reflections from the local fiber 12. For example, upon transmission of a pulse, the analyzer 27 may be configured to ignore reflections until a sufficient delay has passed to ensure that the optical detector 20 is receiving reflections from the fiber 14. At that point, the analyzer 27 may then measure the amount of optical power received for the reflections in order to provide a sample measurement to be used by the tuning element 21, similar to the samples described above for the embodiment shown by FIG. 6. In such an embodiment, the sample should be defined based on the reflections F that have been reflected from points along the main fiber 14 and should substantially free of the reflections N that have been reflected from local fibers 12 and other points along the path 1 closer to the transmission system 11 than the WDM 13.

For such an embodiment, various techniques can be used to determine the delay corresponding to reflections from the WDM 13. For example, to find such delay, the optical return analyzer 15 could be configured to begin measuring optical returns at different delays for a plurality of samples. As an example, for one sample, the analyzer 15 could begin measuring optical returns after a first delay from the time of transmission of the sample's pulse. For the next sample, the analyzer 15 could begin measuring optical returns after a second delay that is slightly greater than the first delay. This process can be repeated to define any number of samples as may be desired. The samples may then be analyzed to identify a substantial magnitude step change in the samples indicative of attenuation from the WDM 13, similar to the techniques described above for finding a substantial magnitude step change in the OTDR values. The delay associated with the sample experiencing such substantial drop represents the delay corresponding to the WDM 13. Thus, using a delay at least as large as the one corresponding to the WDM 13 should ensure that the samples are free of reflections N from points closer to the transmission system 11 than the WDM 13.

Once the delay for the WDM 13 is found, the wavelength of the pulses from the laser 26 can be varied in order to find a wavelength at which the pulse reflections from points beyond the WDM 13 are at a maximum, similar to the techniques described above for the embodiment shown by FIG. 6 in order to find the wavelength that results in a maximum of the return power value 76 derived from OTDR values. The wavelength of the laser 26 can then be tuned to such wavelength, which should be at or close to the center of the passband for the associated channel.

The use of pulses will likely work well for initial channel acquisition. However, a drawback to this approach is that the transmission of data may need to be suspended while the pulses are propagating through the optical path. Thus, to correct for drift of the laser over time using pulses injected into the optical path, data transmission may need to be interrupted from time-to-time to allow for the transmission of pulses. Using a correlative approach, such as some of the OTDR approaches described above, allows the optimal wavelength to be tracked without the need of suspending data transmission for the injection of pulses.

Figure 13:
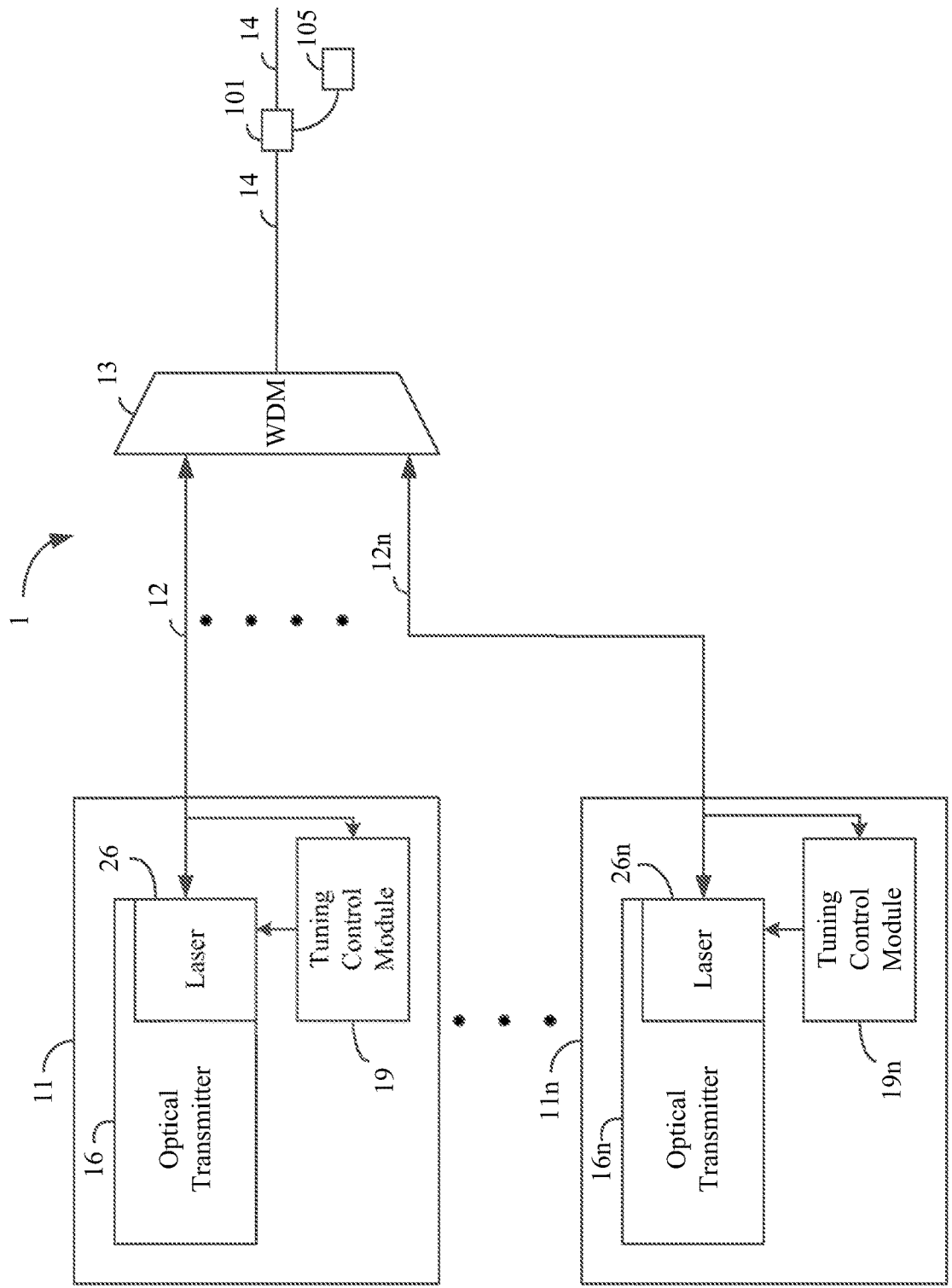
FIG. 13 is a block diagram illustrating an exemplary embodiment of an optical transmission system in which a tunable laser generates an optical signal that is transmitted over an optical path including a wavelength division multiplexer.

FIG. 13 depicts another embodiment that includes an optical tap 101 inserted into the main fiber 14. The optical tap 101 is coupled to a reflective element 105 (e.g., a mirror), as shown by FIG. 13. At least a portion of the optical signal (e.g., pulses) is directed to the reflective element 105 by the tap 101 and reflects from the reflective element back to the transmission system 11. The reflections are received by the optical detector 20, and the tuning control module 19 measures a strength of the reflections to define a sample that can be used to make tuning decisions as described above. As an example, the wavelength of the signal from the laser 26 can be varied in order to find a wavelength at which the reflections are at a maximum, similar to the techniques described above. The wavelength of the laser 26 can then be tuned to such wavelength, which should be at or close to the center of the passband for the associated channel.

If range gating is not employed, then a strong reflection inadvertently introduced at a point prior the WDM 13 (for example as a result of a poorly seated connector) may cause the tuning control module 19 to tune to an incorrect wavelength. However, by performing range gating, as described above, the tuning control module 19 may be configured to ignore reflections from points prior to the WDM 13 and tune the laser 26 based on reflections from points beyond the WDM 13. Thus, the tuning should be based on estimates of power that passes through the WDM 13, thereby enabling the module 19 to tune to the optimal wavelength despite faults that may be present between the laser 26 and the WDM 13.

The foregoing is merely illustrative of the principles of this disclosure and various modifications may be made by those skilled in the art without departing from the scope of this disclosure. The above described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following claims.

Now, therefore, the following is claimed:

1. An optical transmission system, comprising:
   an optical transmitter having a laser configured to transmit an optical signal along an optical path including at least an optical fiber and an optical component that attenuates a first range of wavelengths of the optical signal greater than a second range of wavelengths of the optical signal, wherein the optical transmitter is coupled to the optical component and the optical fiber such that the optical signal propagates from the optical transmitter through the optical component to the optical fiber;
   an optical detector coupled to the optical path, the optical detector configured to receive reflections of the optical signal from the optical path; and
   a tuning control module coupled to the optical detector and configured to determine a value indicative of an amount of optical power received by the optical detector from reflections of the optical signal returned from points in the optical path at least beyond the optical component relative to the optical transmitter, including at least one point of the optical fiber, the tuning control module further configured to tune a wavelength of the optical signal based on the value such that the wavelength of the optical signal is within the second range of wavelengths.

2. The system of claim 1, wherein the optical component comprises a wavelength division multiplexer.

3. The system of claim 1, wherein the tuning control module is configured to identify, based on delay in the optical path, the reflections of the optical signal returned from the points in the optical path at least beyond the optical component, and wherein the tuning control module is configured to determine the value based on the identified reflections returned from the points in the optical path at least beyond the optical component.

4. The system of claim 1, wherein the tuning control module comprises an optical time domain reflectometer (OTDR) configured to determine OTDR values indicative of the reflections of the optical signal returned from the points in the optical path at least beyond the optical component, wherein each of the OTDR values indicates an amount of light reflected from a corresponding point of the optical fiber, and wherein the tuning control module is configured to tune the wavelength of the optical signal based on the OTDR values.

5. The system of claim 4, wherein the OTDR is configured to detect an anomaly along the optical fiber based on the OTDR values.

6. An optical transmission system, comprising:
an optical transmitter coupled to an optical fiber, the optical transmitter including a tunable laser configured to transmit an optical signal along an optical path that includes the optical fiber and an optical component that attenuates a first range of wavelengths of the optical signal greater than a second range of wavelengths of the optical signal, wherein a wavelength of the optical signal varies based on a tuning signal provided to the optical transmitter;
an optical detector configured to receive reflections of the optical signal from the optical path; and
a tuning control module coupled to the optical detector and configured to distinguish between (1) reflections of the optical signal received by the optical detector from points in the optical path between the optical transmitter and the optical component and (2) reflections of the optical signal received by the optical detector from points in the optical path at least beyond the optical component relative to the optical transmitter, including at least one point of the optical fiber, the tuning control module configured to determine a value indicative of an amount of optical power received by the optical detector from the reflections of the optical signal received by the optical detector from the points in the optical path at least beyond the optical component relative to the optical transmitter, the tuning module further configured to control the tuning signal based on the value such that the wavelength of the optical signal is within the second range of wavelengths.

7. The optical transmission system of claim 6, wherein the optical component comprises a wavelength division multiplexer coupled between the tunable laser and the optical fiber.

8. The optical transmission system of claim 6, wherein the optical fiber is coupled to the optical component such that the optical signal passes from the tunable laser through the optical component to the optical fiber, and wherein at least one of the values indicates a strength of the reflections from the optical fiber.

9. The optical transmission system of claim 6, wherein the tuning control module comprises an optical time domain reflectometer (OTDR) configured to determine OTDR values indicative of the reflections of the optical signal received by the optical detector from the points in the optical path at least beyond the optical component, and wherein the tuning control module is configured to control the tuning signal based on the OTDR values.

10. A method, comprising:
transmitting, from a tunable laser of an optical transmitter, an optical signal along an optical path that includes an optical component that attenuates a first range of wavelengths of the optical signal greater than a second range of wavelengths of the optical signal, wherein a wavelength of the optical signal varies based on a tuning value provided to the tunable laser;
receiving a reflected signal from the optical path at an optical detector, the reflected signal comprising reflections of the optical signal from the optical path;
identifying at least one portion of the reflected signal that has passed through the optical component;
determining a plurality of values based on the at least one portion, wherein each of the values indicates a strength of reflections of the optical signal that have passed through the optical component; and
tuning the wavelength of the optical signal based on the values.

11. The method of claim 10, wherein the optical component comprises a wavelength division multiplexer coupled between the tunable laser and the optical fiber.

12. The method of claim 10, wherein the optical path includes an optical fiber coupled to the optical component such that the optical signal passes from the tunable laser through the optical component to the optical fiber, and wherein each of the values indicates a respective strength of the reflections from a corresponding point along the optical fiber.

13. The method of claim 10, wherein the determining is performed by an optical time domain reflectometer (OTDR).

14. The method of claim 13, wherein the OTDR comprises a correlation OTDR.

15. A method, comprising:
transmitting an optical signal from a tunable laser through an optical path including at least an optical component and an optical fiber coupled to the optical component, wherein the optical component attenuates a first range of wavelengths of the optical signal greater than a second range of wavelengths of the optical signal;
receiving reflections of the optical signal from the optical path;
determining a plurality of values indicative of portions of the reflections returned from points in the optical path beyond the optical component such that the portions have passed through the optical component; and
tuning a wavelength of the optical signal based on the values such that the wavelength of the optical signal is within the second range of wavelengths.

16. The method of claim 15, wherein the optical component comprises a wavelength division multiplexer.

17. The method of claim 15, further comprising detecting an anomaly along the optical fiber based on the values.

18. The method of claim 15, wherein the determining is performed by an optical time domain reflectometer.

19. The method of claim 15, further comprising:
  identifying the portions of the reflections returned from the points in the optical path beyond the optical component based on delay in the optical path; and
  selecting, based on the identified portions, the plurality of values for use in the tuning.

* * * * *